(12) United States Patent
Tamura et al.

(10) Patent No.: US 8,461,590 B2
(45) Date of Patent: Jun. 11, 2013

(54) PHOTODETECTOR CIRCUIT, INPUT DEVICE, AND INPUT/OUTPUT DEVICE

(75) Inventors: Hikaru Tamura, Kanagawa (JP); Yoshiyuki Kurokawa, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 7 days.

(21) Appl. No.: 13/313,539

(22) Filed: Dec. 7, 2011

(65) Prior Publication Data

US 2012/0146027 A1 Jun. 14, 2012

(30) Foreign Application Priority Data

Dec. 9, 2010 (JP) ................................ 2010-274697
May 13, 2011 (JP) ................................ 2011-108272

(51) Int. Cl.
*H01L 29/04* (2006.01)
(52) U.S. Cl.
USPC ................... 257/53; 257/55; 257/57; 257/66; 257/191; 257/225; 438/59; 438/60; 438/106
(58) Field of Classification Search
None
See application file for complete search history.

(56) References Cited

U.S. PATENT DOCUMENTS

| | | | |
|---|---|---|---|
| 5,731,613 A | 3/1998 | Yamazaki et al. | |
| 6,025,607 A | 2/2000 | Ohori et al. | |
| 7,465,958 B2 | 12/2008 | Arao et al. | |
| 2009/0027372 A1* | 1/2009 | Shishido et al. | 345/207 |
| 2009/0072321 A1 | 3/2009 | Arao et al. | |
| 2009/0147191 A1 | 6/2009 | Nakajima et al. | |
| 2011/0176038 A1 | 7/2011 | Kurokawa et al. | |
| 2011/0215323 A1 | 9/2011 | Kurokawa et al. | |
| 2011/0220889 A1 | 9/2011 | Kurokawa et al. | |
| 2011/0221723 A1 | 9/2011 | Kurokawa et al. | |

FOREIGN PATENT DOCUMENTS

| | | |
|---|---|---|
| EP | 2 053 450 A1 | 4/2009 |
| JP | 05-251700 | 9/1993 |
| JP | 2007-104186 | 4/2007 |
| JP | 2008-233257 | 10/2008 |

\* cited by examiner

*Primary Examiner* — Kyoung Lee
(74) *Attorney, Agent, or Firm* — Nixon Peabody LLP; Jeffrey L. Costellia

(57) ABSTRACT

An adverse effect of parasitic capacitance on optical data output from a photodetector circuit is suppressed. A photodetector circuit includes a photoelectric conversion element; a first field-effect transistor; a second field-effect transistor; a first conductive layer functioning as a gate of the first field-effect transistor; an insulating layer provided over the first conductive layer; a semiconductor layer overlapping with the first conductive layer with the insulating layer interposed therebetween; a second conductive layer electrically connected to the semiconductor layer; and a third conductive layer electrically connected to the semiconductor layer, whose pair of side surfaces facing each other overlaps with at least one conductive layer including the first conductive layer with the insulating layer interposed therebetween, and which functions as the other of the source and the drain of the first field-effect transistor.

20 Claims, 29 Drawing Sheets

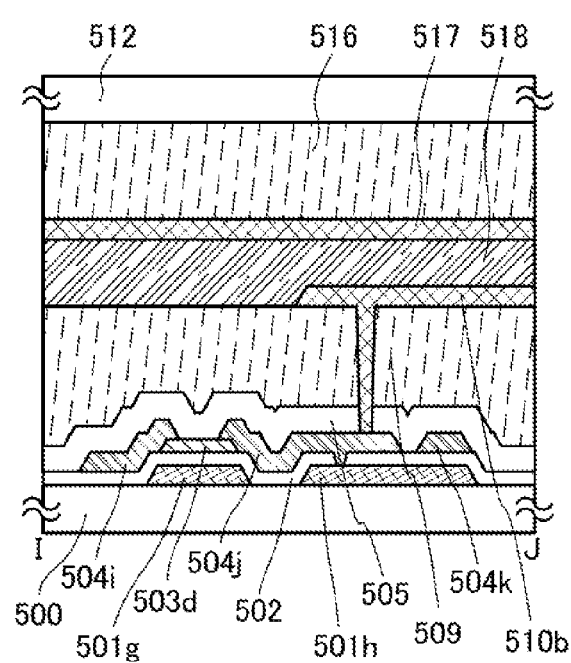

FIG. 14A  FIG. 14B
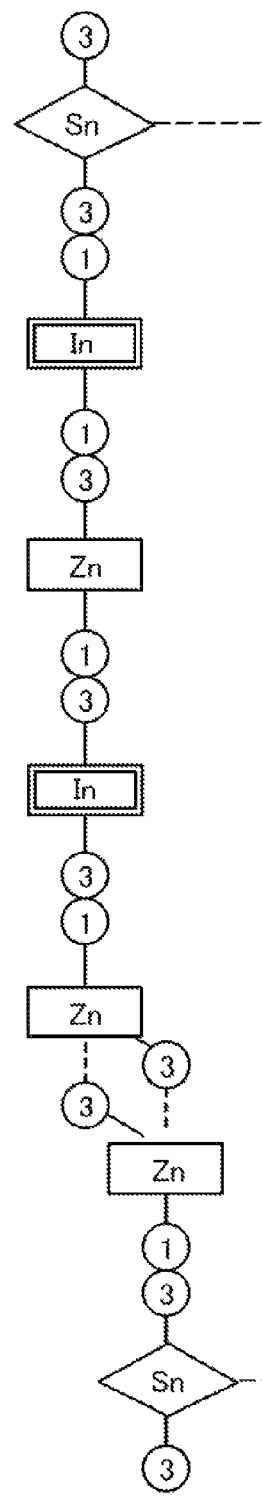
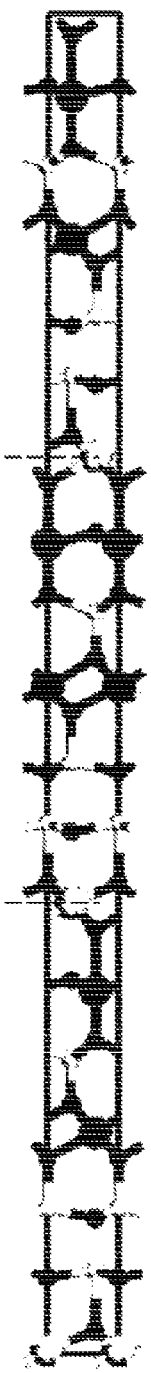
FIG. 14C
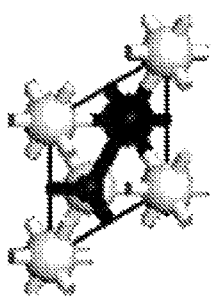
● In
☾ Sn
☽ Zn
● O

● In
○ Ga
○ Zn
● O

PHOTODETECTOR CIRCUIT, INPUT DEVICE, AND INPUT/OUTPUT DEVICE

BACKGROUND OF THE INVENTION

1. Field of the Invention

One embodiment of the present invention relates to a photodetector circuit. Further, one embodiment of the present invention relates' to an input device. Further, one embodiment of the present invention relates to an input/output device.

2. Description of the Related Art

In recent years, technological development of an input device which inputs data with the use of a photodetector circuit (also referred to as an optical sensor) capable of generating data having a value corresponding to the illuminance of incident light, an input/output device which inputs data with the use of the photodetector circuit and outputs data in accordance with the input data, and the like has been advanced.

As an example of the input device, an image sensor can be given. As examples of the image sensor; a CCD (charge coupled device) image sensor, a CMOS (complementary metal oxide semiconductor) image sensor, and the like can be given (e.g., Patent Document 1).

As an example of the input/output device, an input/output device which includes a plurality of display circuits and a plurality of photodetector circuits in a pixel portion and has a function of detecting coordinates of an object to be detected which overlaps with the pixel portion (also referred to as a coordinate detecting function) by detecting light incident on the photodetector circuits and a function of generating image data of the object to be detected (also referred to as a reading function) can be given (e.g., Patent Document 2). For example, with the coordinate detecting function, the input/output device can also function as a touch panel. Further, with the reading function, the input/output device can also function as a scanner and can display an image based on image data generated with the reading function by using the plurality of display circuits.

The photodetector circuit in the above input device or the above input/output device includes a photoelectric conversion element, a charge accumulation control transistor, and an amplifier transistor. In this case, when the charge accumulation control transistor is turned on, the voltage of a gate of the amplifier transistor is changed in accordance with the illuminance of light incident on the photoelectric conversion element. Then, the charge accumulation control transistor is turned off, whereby the changed voltage of the gate of the amplifier transistor is held as data, and voltage having a value corresponding to current that flows between a source and a drain of the amplifier transistor in accordance with the held voltage of the gate of the amplifier transistor is output as output data.

REFERENCES

Patent Documents

[Patent Document 1] Japanese Published Patent Application No. 2007-104186

[Patent Document 2] Japanese Published Patent Application No. 2008-233257

SUMMARY OF THE INVENTION

However, a conventional photodetector circuit has a problem in that the value of optical data varies depending on parasitic capacitance.

For example, the input device disclosed in Patent Document 1 or the input/output device disclosed in Patent Document 2 has a period during which a gate of an amplifier transistor in a photodetector circuit is in a floating state. When parasitic capacitance exists between a gate of the charge accumulation control transistor and each of a source and a drain of the charge accumulation control transistor, the value of optical data varies depending on the voltage of the gate of the charge accumulation control transistor in the period. In particular, in the conventional photodetector circuit, current flowing through the photoelectric conversion element is amplified with the use of the amplifier transistor, converted into voltage, and output as optical data; thus, the photodetector circuit is greatly affected even by small parasitic capacitance.

Moreover, in manufacturing a photodetector circuit, the position of the pattern of each layer included in the photodetector circuit may be deviated from a position as designed in some cases. For example, when light exposure for formation of a resist mask, which is used for forming the pattern of each layer included in the photodetector circuit, is performed more than once, the position of the pattern of each layer included in the photodetector circuit might be deviated from the position as designed. In such a case, when a plurality of photodetector circuits are manufactured at the same time, variation in parasitic capacitance between the gate of the charge accumulation control transistor and each of the source and the drain of the charge accumulation control transistor may be caused among the photodetector circuits, in which case, for example, even when light with the same illuminance is incident, the value of optical data might differ among photodetector circuits on which the light is incident.

An object of one embodiment of the present invention is to suppress an adverse effect of parasitic capacitance in a photodetector circuit.

In one embodiment of the present invention, in order that the sum of capacitances added to the gate of the amplifier transistor in the photodetector circuit have a value within a certain range, the overlap areas of a plurality of conductive layers forming the capacitances are adjusted; thus, an adverse effect of parasitic capacitance is suppressed.

One embodiment of the present invention is a photodetector circuit including a photoelectric conversion element including a first current terminal and a second current terminal, in which photocurrent flows between the first current terminal and the second current terminal in accordance with the illuminance of incident light; a first field-effect transistor whose one of a source and a drain is electrically connected to the second current terminal of the photoelectric conversion element; a second field-effect transistor whose gate is electrically connected to the other of the source and the drain of the first field-effect transistor; a first conductive layer functioning as a gate of the first field-effect transistor; an insulating layer provided over the first conductive layer and functioning as a gate insulating layer of the first field-effect transistor; a semiconductor layer overlapping with the first conductive layer with the insulating layer interposed therebetween and functioning as a channel formation layer of the first field-effect transistor; a second conductive layer electrically connected to the semiconductor layer and functioning as the one of the source and the drain of first field-effect transistor; and a third conductive layer which is electrically connected to the semiconductor layer, whose pair of side surfaces facing each other overlaps with at least one conductive layer including the first conductive layer with the insulating layer interposed therebetween, and which functions as the other of the source and the drain of the first field-effect transistor.

In this case, as an example of the conductive layer overlapping with at least one of the pair of side surfaces of the third conductive layer, a conductive layer functioning as a signal line or a wiring can be given. Further, in the case where a transistor other than the first field-effect transistor and the second field-effect transistor is provided, a conductive layer functioning as an electrode having a function as a gate of the transistor can be given, and in the case where a capacitor is provided, a conductive layer functioning as an electrode of the capacitor can be given.

Further, one embodiment of the present invention is an input device including a photodetector circuit with the above structure in a pixel portion.

In addition, one embodiment of the present invention is an input/output device including a photodetector circuit with the above structure and a display circuit in a pixel portion.

According to one embodiment of the present invention, an adverse effect of parasitic capacitance on optical data in a photodetector circuit can be suppressed.

BRIEF DESCRIPTION OF THE DRAWINGS

FIG. 11 illustrates a structural example of a semiconductor device.

FIGS. 14A to 14C illustrate a structure of an oxide material.

DETAILED DESCRIPTION OF THE INVENTION

Examples of embodiments of the present invention will be described below with reference to the drawings. Note that it is easy for those skilled in the art to change contents in an embodiment without departing from the spirit and the scope of the present invention. The present invention is therefore not limited to the following description of the embodiments.

Note that the contents of the embodiments can be combined with each other as appropriate. In addition, the contents of the embodiments can be replaced with each other.

Further, the ordinal numbers such as "first" and "second" are used to avoid confusion between components and do not limit the number of each component.

Embodiment 1

In this embodiment, an example of a photodetector circuit will be described.

The example of the photodetector circuit in this embodiment will be described with reference to FIGS. 1A to 1F.

First, a structural example of the photodetector circuit in this embodiment will be described with reference to FIG. 1A.

Figure 1A:
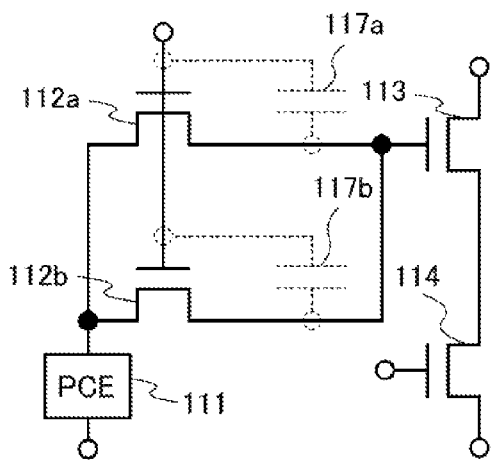
FIGS. 1A to 1F illustrate an example of a photodetector circuit.

The photodetector circuit illustrated in FIG. 1A includes a photoelectric conversion element 111, a transistor 112a, a transistor 112b, a transistor 113, and a transistor 114.

The transistor 112a the transistor 112b, the transistor 113, and the transistor 114 are field-effect transistors.

The photoelectric conversion element 111 includes a first current terminal and a second current terminal, and current (also referred to as photocurrent) flows between the first current terminal and the second current terminal in accordance with the illuminance of incident light.

A photodetection reset signal (also referred to as a signal PRST) that is a pulse signal is input to the first current terminal of the photoelectric conversion element 111. The photodetector circuit in this embodiment may also have a structure in which, instead of the photodetection reset signal, a voltage Va is input to the first current terminal of the photoelectric conversion element 111. In that case, a structure may be employed in which a photodetection reset transistor which is a field-effect transistor is provided, the voltage Va is input to one of a source and a drain of the photodetection reset transistor, the other of the source and the drain of the photodetection reset transistor is connected to a gate of the transistor 113, and a photodetection reset signal is input to a gate of the photodetection reset transistor.

Note that voltage generally refers to a difference between potentials at two points (also referred to as a potential difference). However, voltage and potential may be both represented by volts (V) in a circuit diagram or the like; thus, it is difficult to distinguish them. This is why in this specification, a potential difference between a potential at one point and a potential to be the reference (also referred to as a reference potential) is used as a voltage at the point in some cases unless otherwise specified.

As the photoelectric conversion element 111, a photodiode, a phototransistor, or the like can be used. When the photoelectric conversion element 111 is a photodiode, one of an anode and a cathode of the photodiode corresponds to the first current terminal of the photoelectric conversion element, and the other of the anode and the cathode of the photodiode corresponds to the second current terminal of the photoelectric conversion element. When the photoelectric conversion element 111 is a phototransistor, one of a source and a drain of the phototransistor corresponds to the first current terminal of the photoelectric conversion element, and the other of the source and the drain of the phototransistor corresponds to the second current terminal of the photoelectric conversion element.

One of a source and a drain of the transistor 112a is connected to the second current terminal of the photoelectric conversion element 111, and a charge accumulation control signal (also referred to as a signal TX) that is a pulse signal is input to a gate of the transistor 112a.

The transistor 112a has a function of selecting whether or not charge corresponding to current flowing between the first current terminal and the second current terminal of the photoelectric conversion element 111 is accumulated, and functions as a charge accumulation control transistor having such a function.

One of a source and a drain of the transistor 112b is connected to the second current terminal of the photoelectric conversion element 111, and a charge accumulation control signal is input to a gate of the transistor 112b.

The transistor 112b has a function of selecting whether or not charge corresponding to current flowing between the first current terminal and the second current terminal of the photoelectric conversion element 111 is accumulated, and functions as a charge accumulation control transistor having such a function.

The gate of the transistor 113 is electrically connected to the other of the source and the drain of the transistor 112a and the other of the source and the drain of the transistor 112b.

The transistor 113 has a function of amplifying photocurrent of the photoelectric conversion element 111, and functions as an amplifier transistor having such a function.

One of a source and a drain of the transistor 114 is connected to one of a source and a drain of the transistor 113. An output selection signal (also referred to as a signal OSEL) that is a pulse signal is input to a gate of the transistor 114.

The transistor 114 has a function of selecting whether or not voltage having a value corresponding to current flowing between the source and the drain of the transistor 113 is output as optical data, and functions as an output selection transistor having such a function. Note that the transistor 114 is not necessarily provided; however, with the transistor 114, the timing of outputting optical data from the photodetector circuit can be easily set.

A voltage Vb is input to either the other of the source and the drain of the transistor 113 or the other of the source and the drain of the transistor 114.

Note that one of the voltage Va and the voltage Vb is a high power supply voltage Vdd, and the other is a low power supply voltage Vss. The absolute value of a difference between the values of the voltage Va and the voltage Vb is preferably larger than at least the absolute value of the threshold voltage of the amplifier transistor. The value of the voltage Va and the value of the voltage Vb might interchange depending, for example, on the polarity of the transistor.

A parasitic capacitance 117a exists between the gate of the transistor 112a and the other of the source and the drain of the transistor 112a. Further, a parasitic capacitance 117b exists between the gate of the transistor 112b and the other of the source and the drain of the transistor 112b.

The above is the structural example of the photodetector circuit in FIG. 1A.

Figure 1B:
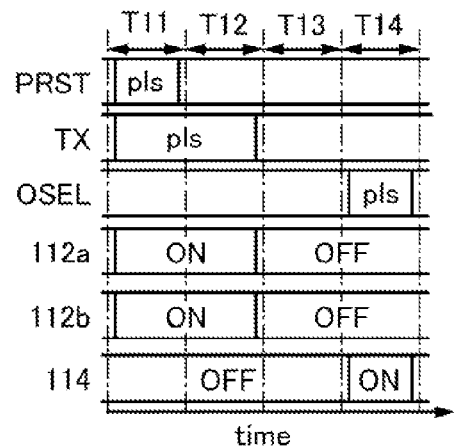

Next, an example of a method for driving the photodetector circuit illustrated in FIG. 1A will be described with reference to FIG. 1B. FIG. 1B is a timing chart for describing the example of the method for driving the photodetector circuit illustrated in FIG. 1A.

In the example of the method for driving the photodetector circuit illustrated in FIG. 1A, first, in a period T11, a pulse (also referred to as pls) of the signal PRST is input. In the period T11 and a period T12, a pulse of the signal TX is, input, so that the transistors 112a and 112b are in the on state (also referred to as the state ON). Note that in the period T11, the timing of starting the input of the pulse of the signal PRST may be earlier than the timing of starting the input of the pulse of the signal TX.

At this time, in the period T11, the photoelectric conversion element 111 is forward-biased, and the voltage of the gate of the transistor 113 is reset.

Further, in the period T12, the photoelectric conversion element 111 is reverse-biased, and the transistors 112a and 112b remain on.

At this time, photocurrent flows between the first current terminal and the second current terminal of the photoelectric conversion element 111 in accordance with the illuminance of light incident on the photoelectric conversion element 111. Further, the voltage value of the gate of the transistor 113 is changed in accordance with the photocurrent. In that case, channel resistance between the source and the drain of the transistor 113 is changed in accordance with the voltage of the gate of the transistor 113.

In addition, after the input of the pulse of the signal TX ends; the transistors 112a and 112b switch to the off state (the state OFF).

Next, in a period T13, the transistors 112a and 112b remain off.

At this time, the voltage of the gate of the transistor 113 is kept at a value corresponding to the photocurrent of the photoelectric conversion element 111 in the period T12. Note that the period T13 is not necessarily provided; however, with provision of the period T13, the timing of outputting a data signal in the photodetector circuit can be set as appropriate. For example, the timing of outputting a data signal in each of the plurality of photodetector circuits can be set as appropriate.

Further, in a period T14, a pulse of the signal OSEL is input, so that the transistor 114 is in the on state.

At this time, the photoelectric conversion element 111 remains reverse-biased and the transistor 114 is in the on state.

Further at this time, current flows through the source and the drain of the transistor 113 and the source and the drain of the transistor 114, and the photodetector circuit illustrated in FIG. 1A outputs optical data as a data signal from the rest of the other of the source and the drain of the transistor 113 and the other of the source and the drain of the transistor 114.

The above is the example of the method for driving the photodetector circuit in FIG. 1A.

Figure 1C:
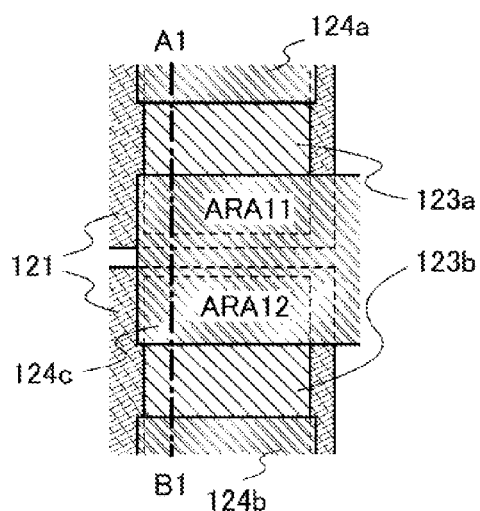

Next, a structural example of part of the photodetector circuit in FIG. 1A will be described with reference to FIGS. 1C and 1D. FIGS. 1C and 1D are schematic views illustrating the structural example of the part of the photodetector circuit in this embodiment. FIG. 1C is a top schematic view, and FIG. 1D is a cross-sectional schematic view along line A1-B1 in FIG. 1C.

The part of the photodetector circuit illustrated in FIGS. 1C and 1D includes a conductive layer 121, an insulating layer 122, a semiconductor layer 123a, a semiconductor layer 123b, a conductive layer 124a, a conductive layer 124b, and a conductive layer 124c.

The conductive layer 121 is provided over one surface of a substrate 120, for example.

The conductive layer 121 functions as the gate of the transistor 112a and the gate of the transistor 112b.

The insulating layer 122 is provided over the conductive layer 121.

The insulating layer 122 functions as a gate insulating layer of the transistor 112a and a gate insulating layer of the transistor 112b. The insulating layer 122 also functions as a gate insulating layer of the transistor 113 and a gate insulating layer of the transistor 114.

The semiconductor layer 123a overlaps with the conductive layer 121 with the insulating layer 122 interposed therebetween.

The semiconductor layer 123a functions as a layer in which a channel of the transistor 112a is formed (also referred to as a channel formation layer).

The semiconductor layer 123b overlaps with the conductive layer 121 with the insulating layer 122 interposed therebetween.

The semiconductor layer 123b functions as a channel formation layer of the transistor 112b.

The conductive layer 124a is electrically connected to the semiconductor layer 123a.

The conductive layer 124a functions as the one of the source and the drain of the transistor 112a.

The conductive layer 124b is electrically connected to the semiconductor layer 123b.

The conductive layer 124b functions as the one of the source and the drain of the transistor 112b.

The conductive layer 124c is electrically connected to the semiconductor layer 123a and the semiconductor layer 123b. The conductive layer 124c has a pair of side surfaces facing each other, and the pair of side surfaces of the conductive layer 124c overlaps with the conductive layer 121 with the insulating layer 122 interposed therebetween.

Note that in FIGS. 1C and 1D, the areas of portions where the conductive layer 124c overlaps with the conductive layer 121 are reduced as much as possible by overlapping side surfaces of the conductive layer 121 with the conductive layer 124c, so that parasitic capacitance formed between the conductive layer 121 and the conductive layer 124c is reduced as much as possible. However, without limitation to this, structure may be employed in which the side surfaces of the conductive layer 121 do not overlap with the conductive layer 124c.

The conductive layer 124c functions as the other of the source and the drain of the transistor 112a and as the other of the source and the drain of the transistor 112b.

Instead of the semiconductor layers 123a and 123b, one semiconductor layer overlapping with the conductive layer 121 with the insulating layer 122 interposed therebetween may be provided over the insulating layer 122, so that the conductive layers 124a to 124c may be electrically connected to the semiconductor layer.

In the photodetector circuit illustrated in FIGS. 1C and 1D, the pair of side surfaces of the conductive layer 124c overlaps with the conductive layer 121 with the insulating layer 122 interposed therebetween. The portions where the conductive layer 124c overlaps with the conductive layer 121 become the parasitic capacitance 117a and the parasitic capacitance 117b which are shown in FIG. 1A. Here, in the portions where the conductive layer 124c overlaps with the conductive layer 121, when a region corresponding to the parasitic capacitance 117a is referred to as a region ARA11 and a region corresponding to the parasitic capacitance 117b is referred to as a region ARA12, the sum of the capacitance of the region ARA11 and the capacitance of the region ARA12 is equal to capacitance added to the gate of the transistor 113. That is, the capacitance added to the gate of the transistor 113 is determined by the sum of the area of the region ARA11 and the area of the region ARA12.

Figure 1E:
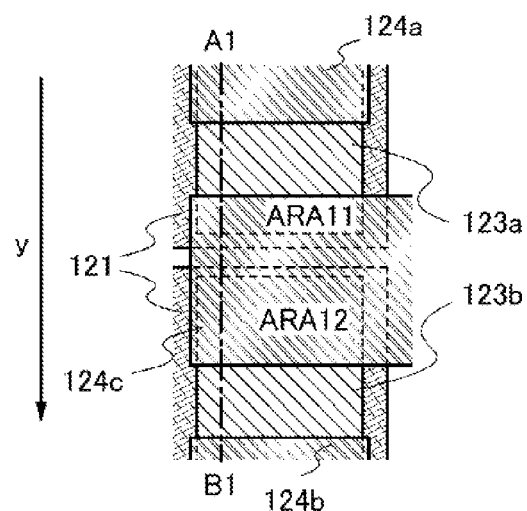
Figure 1D:
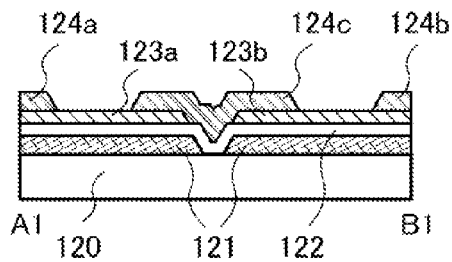
Figure 1F:
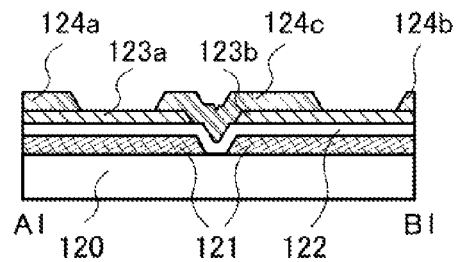

FIGS. 1E and 1F are schematic views of the part of the photodetector circuit in the case where, in manufacture, the positions of the conductive layers 124a to 124c are deviated in a y direction from the positions as designed. In this case, the area of the region ARA11 is decreased, but the area of the region ARA12 is increased correspondingly, so that the sum of the area of the region ARA11 and the area of the region ARA12 is substantially the same as that in the photodetector circuit illustrated in FIGS. 1C and 1D. Note that the same can be said for the case where the position of the conductive layer 121 is deviated. Accordingly, in the photodetector circuit illustrated in FIGS. 1A to 1F, the sum of the parasitic capacitance 117a and the parasitic capacitance 117b can be substantially constant regardless of deviation in the position of each layer.

Next, components will be described below.

The conductive layer 121 can be, for example, a layer of a metal material such as molybdenum, titanium, chromium, tantalum, tungsten, aluminum, copper, neodymium, or scandium. Alternatively, the conductive layer 121 can be a layer containing a conductive metal oxide. As the conductive metal oxide, a metal oxide such as indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), or an alloy of indium oxide and zinc oxide ($In_2O_3$—ZnO); or the metal oxide containing silicon, silicon oxide, or nitrogen can be used, for example. The conductive layer 121 can also be formed by stacking layers of materials applicable to the conductive layer 121. For example, a conductive film of a material applicable to the conductive layer 121 is formed by a sputtering method or the like, and the conductive film is partly removed, whereby the conductive layer 121 can be formed.

As the insulating layer 122, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layer 122 can also be formed by stacking layers of materials applicable to the insulating layer 122. For example, the insulating layer 122 can be formed by formation of a film of a material applicable to the insulating layer 122 by a sputtering method, a chemical vapor deposition (CVD) method, or the like.

As each of the semiconductor layers 123a and 123b, a layer containing an amorphous semiconductor, a microcrystalline semiconductor, a polycrystalline semiconductor, or a single crystal semiconductor can be used, for example.

As each of the semiconductor layers 123a and 123b, a semiconductor layer containing a semiconductor that belongs to Group 14 in the periodic table (e.g., silicon) or an oxide semiconductor layer can be used, for example.

In the case of using an oxide semiconductor layer, an oxide semiconductor to be used therefor preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (EA gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0, and m is not an integer) may be used as the oxide semiconductor. Note that M represents one or more metal elements selected from Ga, Fe, Mn, and Co. Further alternatively, as the oxide semiconductor, a material represented by $In_3SnO_5(ZnO)_n$ (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier concentration, the impurity concentration, the defect density, the atomic ratio of a metal element to Oxygen, the interatomic distance, the density, and the like be set to be appropriate.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative case.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

Note that Ra is obtained by three-dimensionally expanding centerline average roughness that is defined by JIS B0601 so as to be able to be applied to a surface. The Ra can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

In the above formula, $S_0$ represents the area of a measurement plane (a rectangular region which is defined by four points represented by coordinates $(x_1, y_1)$ $(x_1, y_2)$, $(x_2, y_1)$, and $(x_2, y_2)$), and $Z_0$ represents an average height of the measurement plane. Ra can be measured using an atomic force microscope (AFM). Note that the measurement plane is a plane which is shown by all the measurement data, and the measurement data consists of three parameters (X, Y, Z) and is represented by Z=F (X, Y). The range of X (and Y) is from 0 to $X_{max}$ (and $Y_{max}$), and the range of Z is from $Z_{min}$ to $Z_{max}$.

For example, a semiconductor film of a material applicable to the semiconductor layers 123a and 123b is formed by a sputtering method or the like, and the semiconductor film is partly removed, whereby the semiconductor layers 123a and 123b can be formed. Note that after the formation of the semiconductor film of a material applicable to the semiconductor layers 123a and 123b, for example, heat treatment may be performed at higher than or equal to 400° C. and lower than or equal to 750° C., or higher than or equal to 400° C. and lower than the strain point of the substrate.

An In—Sn—Zn-based oxide can be referred to as ITZO. In the case of using ITZO as the oxide semiconductor, an oxide target having a composition ratio of In:Sn:Zn=2:2:3, 2:1:3, 1:1:1, or 20:45:35 in an atomic ratio can be used, for example.

For the above oxide semiconductor layer, an oxide including a crystal with c-axis alignment (also referred to as a c-axis aligned crystal (CAAC)), which has a triangular or hexagonal atomic arrangement when seen from the direction of an a-b plane, a surface, or an interface can be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase that has a triangular, hexagonal, regular triangular or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The oxide including CAAC is not a single crystal, but this does not mean that the oxide including CAAC is composed of only an amorphous component. Although the oxide including CAAC includes a crystallized portion (crystalline portion), a boundary between one crystalline portion and another crystalline portion is not clear in some cases.

In the case where oxygen is included in the oxide including CAAC, nitrogen may be substituted for part of oxygen included in the oxide including CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 13A:
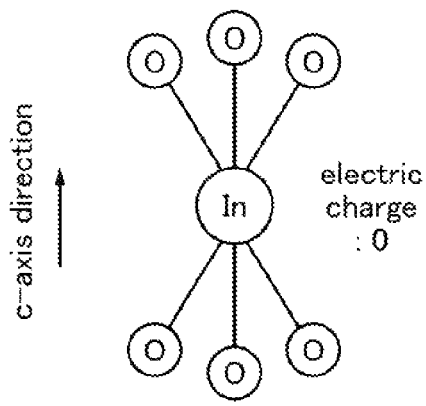
FIGS. 13A to 13E illustrate structures of oxide materials.

FIG. 13A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 13A is actually an octahedral structure, but is illustrated as a planar structure for simplicity. Note that three tetracoordinate O atoms exist in each of an upper half and a lower half in FIG. 13A. In the small group illustrated in FIG. 13A, electric charge is 0.

Figure 13D:
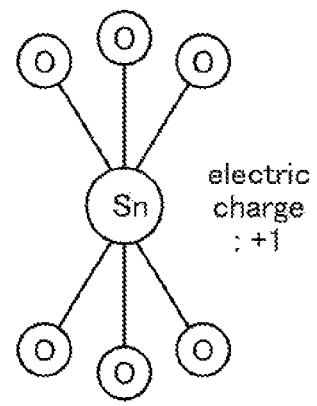
Figure 13B:
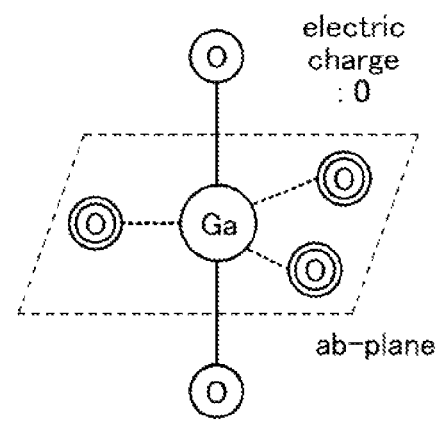

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the small group illustrated in FIG. 13B, electric charge is 0.

Figure 13E:
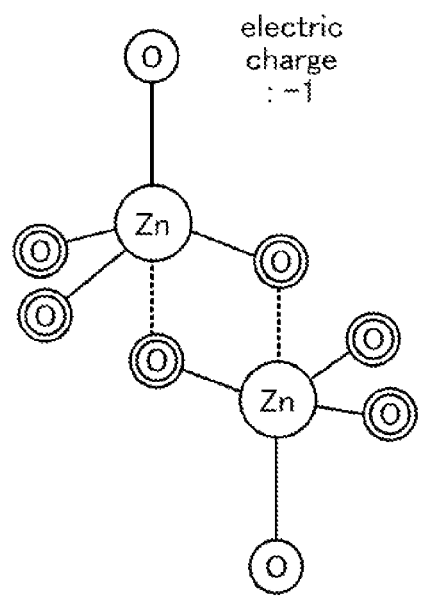
Figure 13C:
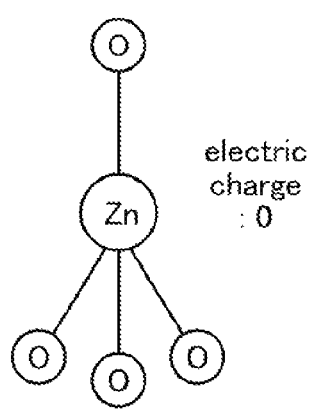

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 13C. In the small group illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half. In the small group illustrated in FIG. 13D, electric charge is +1.

FIG. 13E illustrates a small group including two Zn atoms. In FIG. 13E, one tetracoordinate O atom exists in each of an upper half and a lower half. In the small group illustrated in FIG. 13E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 13A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 14A illustrates a model of a medium group included in a layered structure of an In—Sn—Zn—O-based material. FIG. 14B illustrates a large group including three medium groups. Note that FIG. 14C illustrates an atomic arrangement in the case where the layered structure in FIG. 14B is observed from the c-axis direction.

In FIG. 14A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridnate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, so that the total electric charge of the layered structure can be 0.

When the large group illustrated in FIG. 14B is repeated, an In—Sn—Zn—O-based crystal ($In_2SnZn_3O_8$) can be obtained. Note that a layered structure of the obtained In—Sn—Zn—O-based crystal eau be expressed as a composition formula, In—Sn—$Zn_2O_7(ZnO)_m$(m is 0 or a natural number). As larger m is, the crystallinity of the In—Sn—Zn—O-based crystal is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—PrZn-based oxide, an In—Nd—Zn-based oxide, an In—Sn—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide such as an In-based oxide, a Sn-based oxide, or a Zn-based oxide; and the like.

Figure 15A:
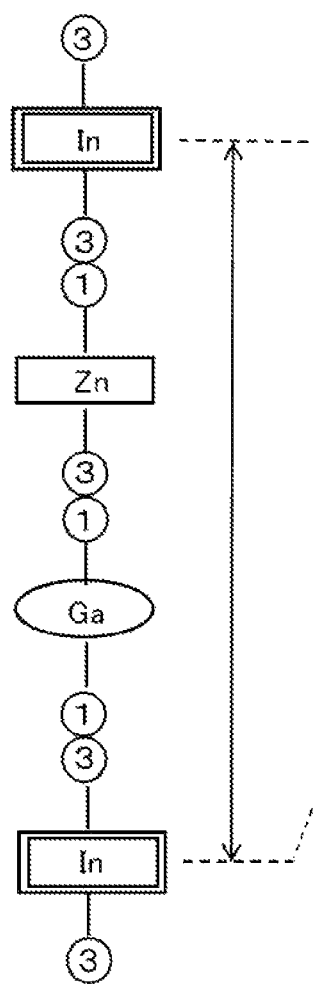
FIGS. 15A to 15C illustrate a structure of an oxide material.

As an example, FIG. 15A illustrates a model of a medium group included in a layered structure of an In—Ga—Zn—O-based material.

In the medium group included in the layered structure of the In—Ga—Zn—O-based material in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 15B:
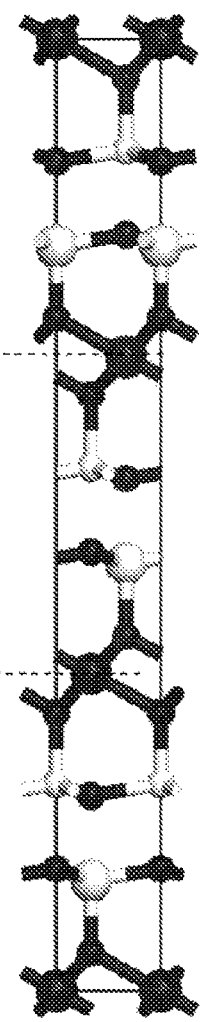
Figure 15C:
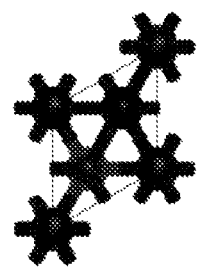

FIG. 15B illustrates a large group including three medium groups. Note that FIG. 15C illustrates an atomic arrangement in the case where the layered structure in FIG. 15B is observed from the c-axis direction.

Here, since electric charge of a (hexacoordinate- or pentacoordinate) In atom, electric charge of a (tetracooridnate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 15A but also a medium group in which the arrangement of the In atom, the Ga atom, and the Zn atom is different from that in FIG. 15A.

An oxide semiconductor layer including CAAC can be formed, for example, in the following manner: an oxide semiconductor film is formed while the temperature of a substrate is set higher than or equal to 100° C. and lower than or equal to 500° C., and then the oxide semiconductor film is subjected to heat treatment, so that an oxide semiconductor layer is formed. Alternatively, the oxide semiconductor layer may be a stack of a plurality of oxide semiconductor layers. With the use of the oxide semiconductor layer including CAAC, a change in electric characteristics of a transistor due to light can be suppressed, for example.

Each of the conductive layers 124a to 124c can be a layer of a material applicable to the conductive layer 121, for example. The conductive layers 124a to 124c can also be formed by stacking layers of materials applicable to the conductive layers 124a to 124c.

For example, a conductive film of a material applicable to the conductive layers 124a to 124c is formed over the insulating layer 122 by a sputtering method or the like, and the conductive film is partly removed, whereby the conductive layers 124a to 124c can be formed in the same process.

As illustrated in FIGS. 1A to 1F, the example of the photodetector circuit in this embodiment includes at least a photoelectric conversion element, two charge accumulation control transistors, and an amplifier transistor.

In the example of the photodetector circuit in this embodiment, sources or drains of the two charge accumulation control transistors are electrically connected to a second current terminal of the photoelectric conversion element, the others of the sources and drains of the two charge accumulation control transistors are electrically connected to a gate of the amplifier transistor, and a pair of facing side surfaces of a conductive layer functioning as the others of the sources and drains of the two charge accumulation control transistors overlaps with a conductive layer functioning as gates of the two charge accumulation control transistors with an insulating layer interposed therebetween.

With the above structure, parasitic capacitance between the gate of each charge accumulation control transistor and each of the source and the drain of each charge accumulation control transistor, which is added to the gate of the amplifier transistor, can be substantially constant regardless of deviation in the position of each layer in manufacture, so that an adverse effect of parasitic capacitance on optical data can be suppressed.

Embodiment 2

In this embodiment, an example of a photodetector circuit whose structure is partly different from that in Embodiment 1 will be described. Note that the description of the photodetector circuit in Embodiment 1 can be referred to as appropriate for the same portions as those in the photodetector circuit described in Embodiment 1.

The example of the photodetector circuit in this embodiment will be described with reference to FIGS. 2A to 2F.

First, a structural example of the photodetector in this embodiment is described with reference to FIG. 2A.

Figure 2A:
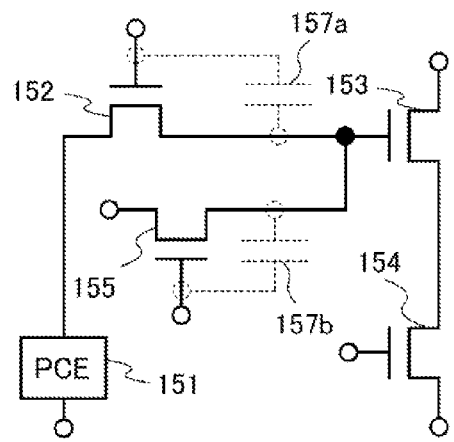
FIGS. 2A to 2F illustrate an example of a photodetector circuit.

The photodetector circuit illustrated in FIG. 2A includes a photoelectric conversion element 151, a transistor 152, a transistor 153, a transistor 154, and a transistor 155.

The transistor 152, the transistor 153, the transistor 154, and the transistor 155 are field-effect transistors.

The photoelectric conversion element 151 includes a first current terminal and a second current terminal, and photocurrent flows between the first current terminal and the second current terminal in accordance with the illuminance of incident light.

The voltage Va which is a unit voltage is input to the first current terminal of the photoelectric conversion element 151.

As in the photoelectric conversion element 111 illustrated in FIG. 1A, for example, a photodiode, a phototransistor, or the like can be used as the photoelectric conversion element 151.

One of a source and a drain of the transistor 152 is connected to the second current terminal of the photoelectric conversion element 151. A charge accumulation control signal (a signal TX) is input to a gate of the transistor 152, as in the transistors 112a and 112b illustrated in FIG. 1A. The transistor 152 has a function of selecting whether or not charge corresponding to current flowing between the first current terminal and the second current terminal of the photoelectric conversion element 151 is accumulated, and functions as a charge accumulation control transistor having such a function.

A gate of the transistor 153 is electrically connected to the other of the source and the drain of the transistor 152.

One of a source and a drain of the transistor 154 is connected to one of a source and a drain of the transistor 153. An output selection signal (a signal OSEL) is input to a gate of the transistor 154, as in the transistor 114 illustrated in FIG. 1A.

The voltage Vb is input to either the other of the source and the drain of the transistor 153 or the other of the source and the drain of the transistor 154.

The voltage Va is input to one of a source and a drain of the transistor 155, the other of the source and the drain of the transistor 155 is connected to the gate of the transistor 153, and a photodetection reset signal (a signal PRST) is input to a gate of the transistor 155. The transistor 155 has a function of selecting whether or not the gate of the transistor 153 is placed in a reset state, and functions as a photodetection reset transistor having such a function.

A parasitic capacitance 157a exists between the gate of the transistor 152 and the other of the source and the drain of the transistor 152. Further, a parasitic capacitance 157b exists between the gate of the transistor 155 and the other of the source and the drain of the transistor 155.

The above is the structural example of the photodetector circuit in FIG. 2A.

Figure 2B:
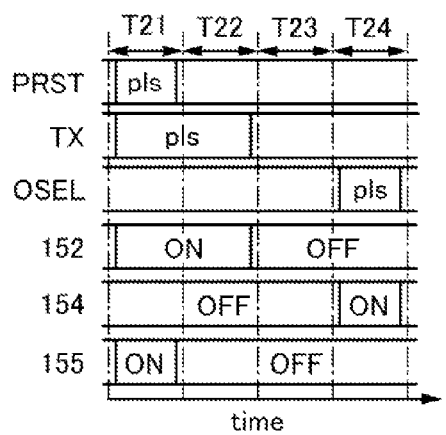

Next, an example of a method for driving the photodetector circuit illustrated in FIG. 2A will be described with reference to FIG. 2B. FIG. 2B is a timing chart for describing the example of the method for driving the photodetector circuit illustrated in FIG. 2A.

In the example of the method for driving the photodetector circuit illustrated in FIG. 2A, first, in a period T21, a pulse of the signal PRST is input, so that the transistor 155 is in the on state. In the period T21 and a period T22, a pulse of the signal TX is input, so that the transistor 152 is in the on state. Note that in the period T21, the timing of starting the input of the pulse of the signal PRST may be earlier than the timing of starting the input of the pulse of the signal TX.

At this time, in the period T21, the voltage of the gate of the transistor 153 is reset to a value equivalent to the voltage Va.

In addition, after the input of the pulse of the signal PRST ends, the transistor 155 switches to the off state.

Further, in the period T22, the photoelectric conversion element 151 is reverse-biased, and the transistor 152 remains on.

At this time, photocurrent flows between the first current terminal and the second current terminal of the photoelectric conversion element 151 in accordance with the illuminance of light incident on the photoelectric conversion element 151. Further, the voltage value of the gate of the transistor 153 is changed in accordance with the photocurrent. In that case, channel resistance between the source and the drain of the transistor 153 is changed in accordance with the voltage of the gate of the transistor 153.

In addition, after the input of the pulse of the signal TX ends, the transistor 152 switches to the off state.

Next, in a period T23, the transistor 152 remains off.

At this time, the voltage of the gate of the transistor 153 is kept at a value corresponding to the photocurrent of the photoelectric conversion element 151 in the period T22. Note that the period T23 is not necessarily provided; however, with provision of the period T23, the timing of outputting a data signal in the photodetector circuit can be set as appropriate. For example, the timing of outputting a data signal in each of the plurality of photodetector circuits can be set as appropriate.

Further, in a period T24, a pulse of the signal OSEL is input, so that the transistor 154 is in the on state.

At this time, the photoelectric conversion element 151 remains reverse-biased and the transistor 154 is in the on state.

Further at this time, current flows through the source and the drain of the transistor 153 and the source and the drain of the transistor 154, and the photodetector circuit illustrated in FIG. 2A outputs optical data as a data signal from the rest of the other of the source and the drain of the transistor 153 and the other of the source and the drain of the transistor 154. The above is the example of the method for driving the photodetector circuit in FIG. 2A.

Figure 2C:
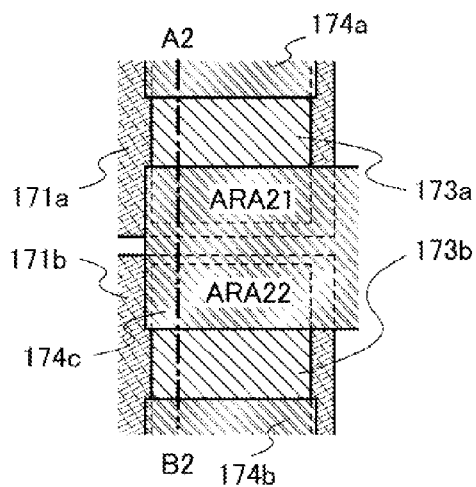

Next, a structural example of part of the photodetector circuit in FIG. 2A will be described with reference to FIGS. 2C and 2D. FIGS. 2C and 2D are schematic views illustrating the structural example of the part of the photodetector circuit in this embodiment. FIG. 2C is a top schematic view, and FIG. 2D is a cross-sectional schematic view along line A2-B2 in FIG. 2C.

The part of the photodetector circuit illustrated in FIGS. 2C and 2D includes a conductive layer 171a, a conductive layer 171b, an insulating layer 172, a semiconductor layer 173a, a semiconductor layer 173b, a conductive layer 174a, a conductive layer 174b, and a conductive layer 174c.

The conductive layers 171a and 171b are provided over one surface of a substrate 170, for example.

The conductive layer 171a functions as the gate of the transistor 152.

The conductive layer 171b functions as the gate of the transistor 155.

The insulating layer 172 is provided over the conductive layers 171a and 171b.

The insulating layer 172 functions as a gate insulating layer of the transistor 152 and a gate insulating layer of the transistor 155. The insulating layer 172 also functions as a gate insulating layer of the transistor 153 and a gate insulating layer of the transistor 154.

The semiconductor layer 173a overlaps with the conductive layer 171a with the insulating layer 172 interposed therebetween.

The semiconductor layer 173a functions as a channel formation layer of the transistor 152.

The semiconductor layer 173b overlaps with the conductive layer 171b with the insulating layer 172 interposed therebetween.

The semiconductor layer 173b functions as a channel formation layer of the transistor 155.

The conductive layer 174a is electrically connected to the semiconductor layer 173a.

The conductive layer 174a functions as the one of the source and the drain of the transistor 152.

The conductive layer 174b is electrically connected to the semiconductor layer 173b.

The conductive layer 174b functions as the one of the source and the drain of the transistor 155.

The conductive layer 174c is electrically connected to the semiconductor layer 173a and the semiconductor layer 173b. The conductive layer 174c has a pair of side surfaces facing each other. One of the pair of side surfaces of the conductive layer 174c overlaps with the conductive layer 171a with the insulating layer 172 interposed therebetween, and the other of the pair of side surfaces of the conductive layer 174c overlaps with the conductive layer 171b with the insulating layer 172 interposed therebetween. Note that "a pair of side surfaces facing each other" includes, for example, but is not necessarily limited to, a pair of side surfaces which are parallel to each other. Further, "a pair of side surfaces facing each other" includes not only a pair of side surfaces facing each other perpendicularly, but also a pair of side surfaces facing each other at an angle other than 90°.

The conductive layer 174c functions as the other of the source and the drain of the transistor 152 and as the other of the source and the drain of the transistor 155.

In the photodetector circuit illustrated in FIGS. 2C and 2D, the one of the pair of facing side surfaces of the conductive layer 174c overlaps with the conductive layer 171a with the insulating layer 172 interposed therebetween, and the other of the pair of side surfaces of the conductive layer 174c overlaps with the conductive layer 171b with the insulating layer 172 interposed therebetween. The portion where the conductive layer 174c overlaps with the conductive layer 171a becomes the parasitic capacitance 157a shown in FIG. 2A, and the portion where the conductive layer 174c overlaps with the conductive layer 171b becomes the parasitic capacitance 157b shown in FIG. 2A. Here, when the portion where the conductive layer 174c overlaps with the conductive layer 171a is referred to as a region ARA21 and the portion where the conductive layer 174c overlaps with the conductive layer 171b is referred to as a region ARA22, the sum of the capacitance of the region ARA21 and the capacitance of the region ARA22 is equal to capacitance added to the gate of the transistor 153. That is, the capacitance added to the gate of the transistor 153 is determined by the sum of the area of the region ARA21 and the area of the region ARA22.

Figure 2E:
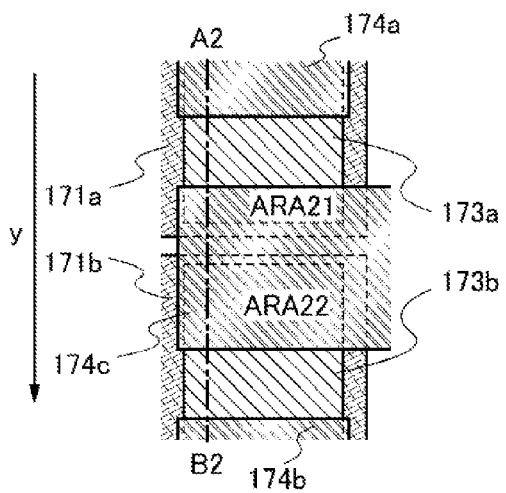
Figure 2D:
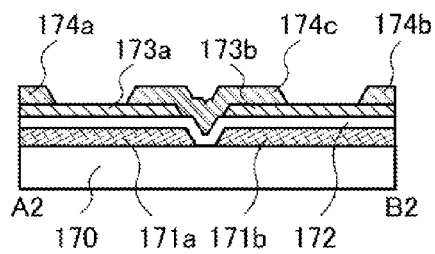
Figure 2F:
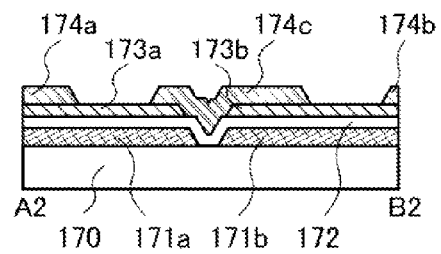

FIGS. 2E and 2F are schematic views of the part of the photodetector circuit in the case where, in manufacture, the positions of the conductive layers 174a to 174c are deviated in a y direction from the positions as designed. In this case, the area of the region ARA21 is decreased, but the area of the region ARA22 is increased correspondingly, so that the sum of the area of the region ARA21 and the area of the region ARA22 is substantially the same as that in the photodetector circuit illustrated in FIGS. 2C and 21/Note that the same can be said for the case where the positions of the conductive layers 171a and 171b are deviated. Accordingly, in the photodetector circuit illustrated in FIGS. 2A to 2F, the sum of the parasitic capacitance 157a and the parasitic capacitance 157b can be substantially constant regardless of deviation in the position of each layer.

Next, components will be described below.

Each of the conductive layers 171a and 171b can be a layer of a material applicable to the conductive layer 121 illustrated in FIGS. 1A to 1F. The conductive layers 171a and 171b can also be formed by stacking layers of materials applicable to the conductive layers 171a and 171b.

For example, a conductive film of a material applicable to the conductive layers 171a and 171b is formed over the substrate 170 by a sputtering method or the like, and the conductive film is partly removed, whereby the conductive layers 171a and 171b can be formed in the same process.

The insulating layer 172 can be a layer of a material applicable to the insulating layer 122 illustrated in FIGS. 1A to 1F, for example. The insulating layer 172 can also be formed by stacking layers of materials applicable to the insulating layer 172.

Each of the semiconductor layers 173a and 173b can be a layer of a material applicable to the semiconductor layers 123a and 123b illustrated in FIGS. 1A to 1F, for example.

Each of the conductive layers 174a to 174c can be a layer of a material applicable to the conductive layers 171a and 171b, for example. The conductive layers 174a to 174c can also be formed by stacking layers of materials applicable to the conductive layers 174a to 174c.

As illustrated in FIGS. 2A to 2F, the example of the photodetector circuit in this embodiment includes at least a photoelectric Conversion element, a charge accumulation control transistor, a photodetection reset transistor, and an amplifier transistor.

In the example of the photodetector circuit in this embodiment, one of a source and a drain of the charge accumulation control transistor is electrically connected to a second current terminal of the photoelectric conversion element, the other of the source and the drain of the charge accumulation control transistor is electrically connected to a gate of the amplifier transistor, one of a pair of facing side surfaces of a conductive layer functioning as the other of the source and the drain of the charge accumulation control transistor and as the other of the source and the drain of the photodetection reset transistor overlaps with a conductive layer functioning as a gate of the charge accumulation control transistor with an insulating layer interposed therebetween, and the other of the pair of side surfaces overlaps with a conductive layer functioning as a gate of the photodetection reset transistor with the insulating layer interposed therebetween.

With the above structure, the sum of parasitic capacitance between the gate of the charge accumulation control transistor and each of the source and the drain of the charge accumulation control transistor and parasitic capacitance between the gate of the photodetection reset transistor and each of the source and the drain of the photodetection reset transistor, which are added to the gate of the amplifier transistor, can be substantially constant regardless of deviation in the position of each layer in manufacture, so that an adverse effect of parasitic capacitance on optical data can be suppressed.

Embodiment 3

In this embodiment, an example of a photodetector circuit whose structure is partly different from those in Embodiments 1 and 2 will be described. Note that the description of the photodetector circuit in Embodiment 1 or 2 can be referred to as appropriate for the same portions as those in the photodetector circuit described in Embodiment 1 or 2.

The example of the photodetector circuit in this embodiment will be described with reference to FIGS. 3A to 3F.

First, a structural example of the photodetector in this embodiment is described with reference to FIG. 3A.

Figure 3A:
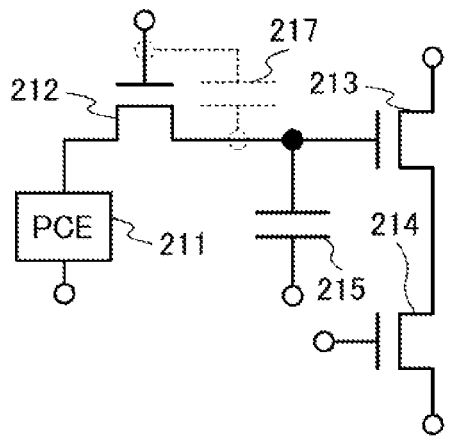
FIGS. 3A to 3F illustrate an example of a photodetector circuit.

The photodetector circuit illustrated in FIG. 3A includes a photoelectric conversion element 211, a transistor 212, a transistor 213, a transistor 214, and a capacitor 215.

The transistor 212, the transistor 213, and the transistor 214 are field-effect transistors.

The photoelectric conversion element 211 includes a first current terminal and a second current terminal, and photocurrent flows between the first current terminal and the second current terminal in accordance with the illuminance of incident light.

A photodetection reset signal (a signal PRST) is input to the first current terminal of the photoelectric conversion element 211, as in the photoelectric conversion element 111 illustrated in FIG. 1A. The photodetector circuit in this embodiment may also have a structure in which, instead of the photodetection reset signal, the voltage Va is input to the first current terminal of the photoelectric conversion element 211. In that case, a structure may be employed in which a photodetection reset transistor which is a field-effect transistor is provided, the voltage Va is input to one of a source and a drain of the photodetection reset transistor, the other of the source and the drain of the photodetection reset transistor is connected to a gate of the transistor 213, and a photodetection reset signal is input to a gate of the photodetection reset transistor.

As in the photoelectric conversion element 111 illustrated in FIG. 1A, for example, a photodiode, a phototransistor, or the like can be used as the photoelectric conversion element 211.

One of a source and a drain of the transistor 212 is connected to the second current terminal of the photoelectric conversion element 211. A charge accumulation control signal (a signal TX) is input to a gate of the transistor 212, as in the transistors 112a and 112b illustrated in FIG. 1A. The transistor 212 has a function of selecting whether or not charge corresponding to current flowing between the first current terminal and the second current terminal of the photoelectric conversion element 211 is accumulated, and functions as a charge accumulation control transistor having such a function.

A gate of the transistor 213 is electrically connected to the other of the source and the drain of the transistor 212.

One of a source and a drain of the transistor 214 is connected to one of a source and a drain of the transistor 213. An output selection signal (a signal OSEL) is input to a gate of the transistor 214, as in the transistor 114 illustrated in FIG. 1A.

The voltage Vb is input to either the other of the source and the drain of the transistor 213 or the other of the source and the drain of the transistor 214.

The capacitor 215 includes a first capacitor electrode, a second capacitor electrode, and a dielectric layer overlapping with the first capacitor electrode and the second capacitor electrode. Note that the first capacitor electrode is also referred to as a first electrode, and the second capacitor electrode is also referred to as a second electrode.

A voltage Vc or a signal is input to the first capacitor electrode of the capacitor 215. The second capacitor electrode of the capacitor 215 is connected to the gate of the transistor 213.

The capacitor 215 functions as a storage capacitor. Note that the capacitance of the capacitor 215 can be determined as appropriate depending on the specifications of the photodetector circuit.

A parasitic capacitance 217 exists between the gate of the transistor 212 and the other or the source and the drain of the transistor 212.

Figure 3B:
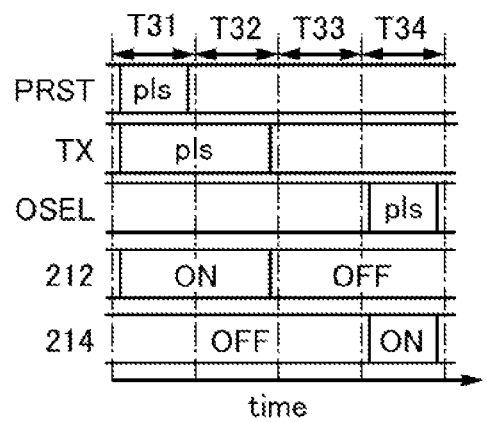

Next, an example of a method for driving the photodetector circuit illustrated in FIG. 3A will be described with reference to FIG. 3B. FIG. 3B is a timing chart for describing the example of the method for driving the photodetector circuit illustrated in FIG. 3A.

In the example of the method for driving the photodetector circuit illustrated in FIG. 3A, first, in a period T31, a pulse of the signal PRST is input. Further, in the period T31 and a period T32, a pulse of the signal TX is input, so that the transistor 212 is in the on state. Note that in the period T31, the timing of stalling the input of the pulse of the signal PRST may be earlier than the timing of starting the input of the pulse of the signal TX.

At this time, in the period T31, the photoelectric conversion element 211 is forward-biased, and the voltage of the gate of the transistor 213 is reset.

Further, in the period T32, the photoelectric conversion element 211 is reverse-biased, and the transistor 212 remains on.

At this time, photocurrent flows between the first current terminal and the second current terminal, of the photoelectric conversion element 211 in accordance with the illuminance of light incident on the photoelectric conversion element 211. Further, the voltage value of the gate of the transistor 213 and the voltage value of the second capacitor electrode of the capacitor 215 are changed in accordance with the photocurrent. En that case, channel resistance between the source and the drain of the transistor 213 is changed in accordance with the voltage of the gate of the transistor 213.

In addition, after the input of the pulse of the signal TX ends, the transistor 212 switches to the off state.

Next, in a period T33, the transistor 212 remains off.

At this time, the voltage of the gate of the transistor 213 and the voltage of the second capacitor electrode of the capacitor 215 are kept at values corresponding to the photocurrent of the photoelectric conversion element 211 in the period T32. Note that the period T33 is not necessarily provided; however, with provision of the period T33, the timing of outputting a data signal in the photodetector circuit can be set as appropriate. For example, the timing of outputting a data signal in each of the plurality of photodetector circuits can be set as appropriate.

Further, in a period T34, a pulse of the signal OSEL is input, so that the transistor 214 is in the on state.

At this time, the photoelectric conversion element 211 remains reverse-biased and the transistor 214 is in the on state.

Further at this time, current flows through the source and the drain of the transistor 213 and the source and the drain of the transistor 214, and the photodetector circuit illustrated in FIG. 3A outputs optical data as a data signal from the rest of the other of the source and the drain of the transistor 213 and the other of the source and the drain of the transistor 214. The above is the example of the method for driving the photodetector circuit in FIG. 3A.

Figure 3C:
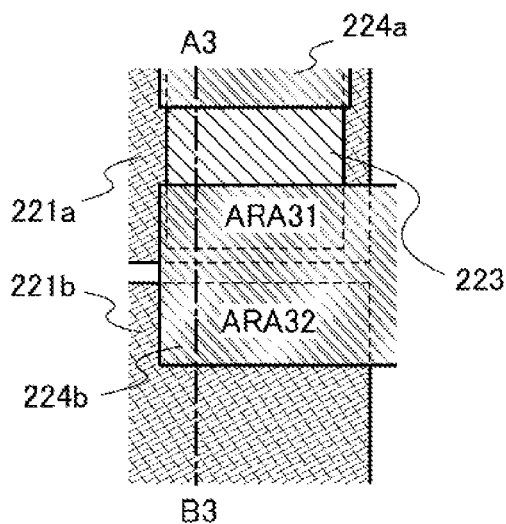

Next, a structural example of part of the photodetector circuit in FIG. 3A will be described with reference to FIGS. 3C and 3D. FIGS. 3C and 3D are schematic views illustrating the structural example of the part of the photodetector circuit in this embodiment. FIG. 3C is a top schematic view, and FIG. 3D is a cross-sectional schematic view along line A3-B3 in FIG. 3C.

The part of the photodetector circuit illustrated in FIGS. 3C and 3D includes a conductive layer 221a, a conductive layer 221b, an insulating layer 222, a semiconductor layer 223, a conductive layer 224a, and a conductive layer 224b.

The conductive layers 221a and 221b are provided over one surface of a substrate 220, for example.

The conductive layer 221a functions as the gate of the transistor 212.

The conductive layer 221b functions as the first capacitor electrode of the capacitor 215.

The insulating layer 222 is provided over the conductive layers 221a and 221b.

The insulating layer 222 functions as a gate insulating layer of the transistor 212 and the dielectric layer of the capacitor 215. The insulating layer 222 also functions as a gate insulating layer of the transistor 213 and a gate insulating layer of the transistor 214.

The semiconductor layer 223 overlaps with the conductive layer 221a with the insulating layer 222 interposed therebetween.

The semiconductor layer 223 functions as a channel formation layer of the transistor 212.

The conductive layer 224a is electrically connected to the semiconductor layer 223.

The conductive layer 224a functions as the one of the source and the drain of the transistor 212.

The conductive layer 224b is electrically connected to the semiconductor layer 223. The conductive layer 224b has a pair of side surfaces facing each other. One of the pair of facing side surfaces of the conductive layer 224b overlaps with the conductive layer 221a with the insulating layer 222 interposed therebetween, and the other of the pair of lacing side surfaces of the conductive layer 224b overlaps with the conductive layer 221b with the insulating layer 222 interposed therebetween.

The conductive layer 224b functions as the other of the source and the drain of the transistor 212 and as the second capacitor electrode of the capacitor 215.

In the photodetector circuit illustrated in FIGS. 3C and 3D, the one of the pair of facing side surfaces of the conductive layer 224b overlaps with the conductive layer 221a with the insulating layer 222 interposed therebetween, and the other of the pair of facing side surfaces of the conductive layer 224b overlaps with the conductive layer 221b with the insulating layer 222 interposed therebetween. The portion where the conductive layer 224b overlaps with the conductive layer 221a becomes the parasitic capacitance 217 shown in FIG. 3A, and the portion where the conductive layer 224b overlaps with the conductive layer 221b becomes the capacitor 215 shown in FIG. 3A. Here, when the portion where the conductive layer 224b overlaps with the conductive layer 221a is referred to as a region ARA31 and the portion where the conductive layer 224b overlaps with the conductive layer 221b is referred to as a region ARA32, the sum of the capacitance of the region ARA31 and the capacitance of the region ARA32 is equal to capacitance added to the gate of the transistor 213. That is, the capacitance added to the gate of the transistor 213 is determined by the sum of the area of the region ARA31 and the area of the region ARA32.

Figure 3E:
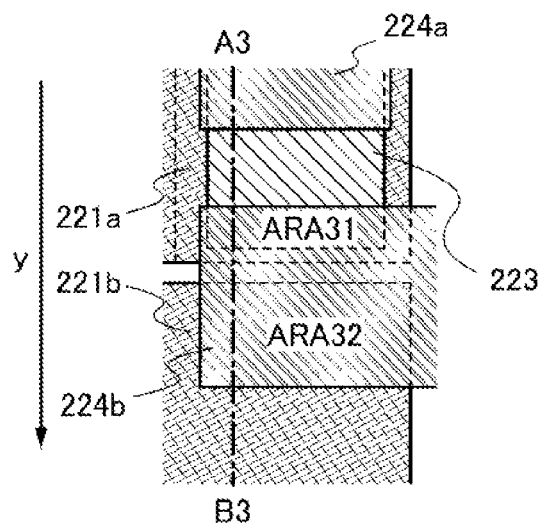
Figure 3D:
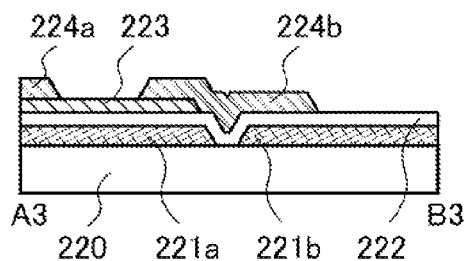
Figure 3F:
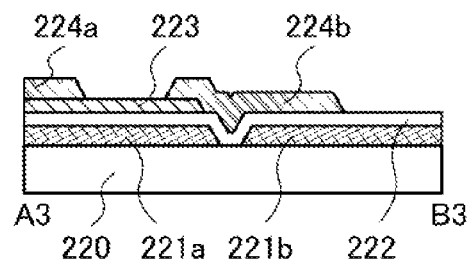

FIGS. 3E and 3F are schematic views of the part of the photodetector circuit in the case where, in manufacture, the positions of the conductive layers 224a and 224b are deviated in a y direction from the positions as designed. In this case, the area of the region ARA31 is decreased, but the area of the region ARA32 is increased correspondingly, so that the sum of the area of the region ARA31 and the area of the region ARA32 is substantially the Same as that in the photodetector circuit illustrated in FIGS. 3C and 3D. Note that the same can be said for the case where the positions of the conductive layers 221a and 221b are deviated. Accordingly, in the photodetector circuit illustrated in FIGS. 3A to 3F, the sum of the capacitance of the capacitor 215 and the parasitic capacitance 217 can be substantially constant regardless of deviation in the position of each layer.

Next, components will be described below.

Each of the conductive layers 221a and 221b can be a layer of a material applicable to the conductive layer 121 illustrated in FIGS. 1A to 1F. The conductive layers 221a and 221b can also be formed by stacking layers of materials applicable to the conductive layers 221a and 221b.

For example, a conductive film of a material applicable to the conductive layers 221a and 221b is formed over the substrate 220 by a sputtering method or the like, and the conductive film is partly removed, whereby the conductive layers 221a and 221b can be formed in the same process.

The insulating layer 222 can be a layer of a material applicable to the insulating layer 122 illustrated in FIGS. 1A to 1F, for example. The insulating layer 222 can also be formed by stacking layers of materials applicable to the insulating layer 222.

The semiconductor layer 223 can be a layer of a material applicable to the semiconductor layers 123a and 123b illustrated in FIGS. 1A to 1F, for example.

Each of the conductive layers 224a and 224b can be a layer of a material applicable to the conductive layers 221a and 221b, for example. The conductive layers 224a and 224b can also be formed by stacking layers of materials applicable to the conductive layers 224a and 224b.

As illustrated in FIGS. 3A to 3F, the example of the photodetector circuit in this embodiment includes at least a photoelectric conversion element, a charge accumulation control transistor, an amplifier transistor, and a Capacitor functioning as a storage capacitor.

Provision of the capacitor functioning as a storage capacitor can further suppress the adverse effect of parasitic capacitance on optical data. For example, variation in the voltage of a gate of the amplifier transistor corresponding to a change in the voltage of a gate of the charge accumulation control transistor can be suppressed.

In the example of the photodetector circuit in this embodiment, one of a source and a drain of the charge accumulation control transistor is electrically connected to a second current terminal of the photoelectric conversion element, the other of the source and the drain of the charge accumulation control transistor is electrically connected to the gate of the amplifier transistor, a second electrode of the capacitor is electrically connected to the gate of the amplifier transistor, one of a pair of facing side surfaces of a conductive layer functioning as the other of the source and the drain of the charge accumulation control transistor and as the second electrode of the capacitor overlaps with a conductive layer functioning as the gate of the charge accumulation control transistor with an insulating layer interposed therebetween, and the other of the pair of side surfaces overlaps with a conductive layer functioning as a first electrode of the capacitor with the insulating layer interposed therebetween.

With the above structure, the sum of parasitic capacitance between the gate of the charge accumulation control transistor and each of the source and the drain of the charge accumulation control transistor and the capacitance of the storage capacitor, which are added to the gate of the amplifier transistor, can be substantially constant regardless of deviation in the position of each layer in manufacture, so that an adverse effect of parasitic capacitance on optical data can be suppressed.

Embodiment 4

In this embodiment, an example of a semiconductor device including any of the photodetector circuits described in the above embodiments in a pixel portion will be described.

Figure 4A:
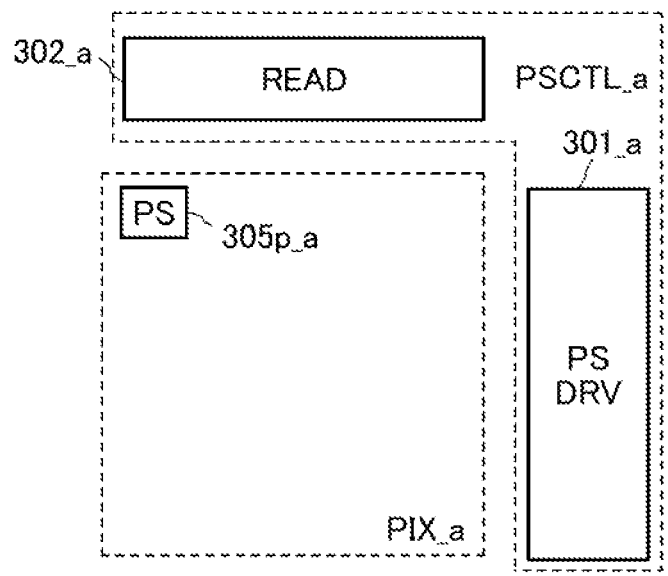
FIGS. 4A and 4B each illustrate a structural example of a semiconductor device.
Figure 4B:
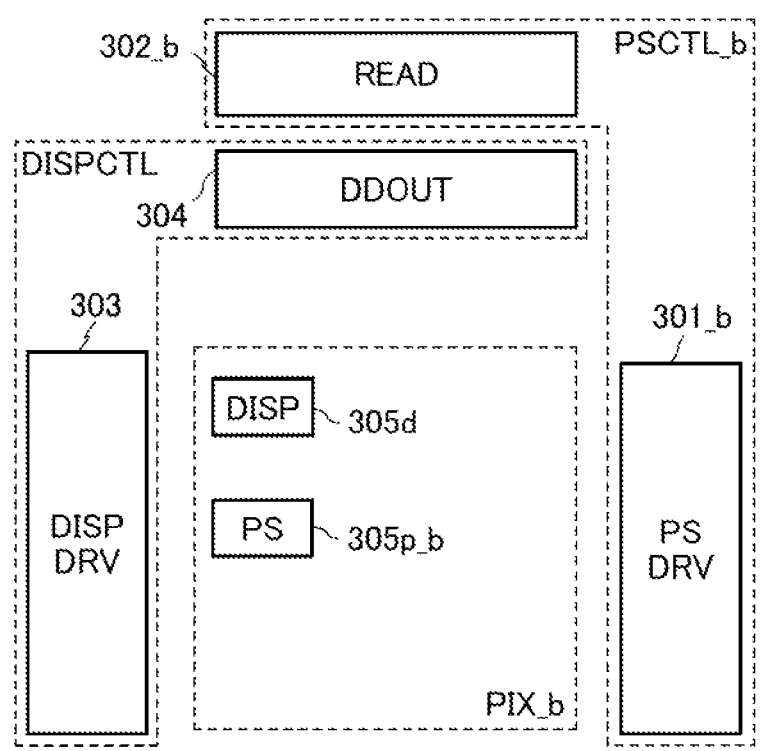

First, structural examples of the semiconductor device in this embodiment are described with reference to FIGS. 4A and 4B. FIGS. 4A and 4B are block diagrams illustrating the structural examples of the semiconductor device in this embodiment.

A semiconductor device illustrated in FIG. 4A is an input device which can input data with light.

The semiconductor device in FIG. 4A includes a photodetection controller PSCTL_a and a pixel portion PIX_a.

Further, the semiconductor device in FIG. 4A includes a photodetection driver circuit (also referred to as PSDRV) 301_a, a reading circuit (also referred to as READ) 302_a, and a plurality of photodetector circuits (also referred to as PS) 305p_a.

The photodetection driver circuit 301_a is provided in the photodetection controller PSCTL_a.

The plurality of photodetector circuits 305p_a are provided in the pixel portion PIX_a. Note that one or more photodetector circuits 305p_a form one pixel in the semiconductor device illustrated in FIG. 4A.

The reading circuit 302_a is provided in the photodetection controller PSCTL_a.

Note that the photodetection controller PSCTL_a is not necessarily included in the semiconductor device (input device) illustrated in FIG. 4A.

A semiconductor device illustrated in FIG. 4B is an input/output device which can input data with light and can output data by displaying an image.

The semiconductor device in FIG. 4B includes a photodetection controller PSCTL_b, a display controller DISPCTL, and a pixel portion PIX_b.

Note that the photodetection controller PSCTL_b and the display controller DISPCTL are not necessarily included in the semiconductor device (input/output device) illustrated in FIG. 4B.

The semiconductor device in FIG. 4B includes a photodetection driver circuit 301_b, a reading circuit 302_b, a display driver circuit 303, a display data signal output circuit 304, a plurality of photodetector circuits 305p_b, and a plurality of display circuits 305d.

The photodetection driver circuit 301_b is provided in the photodetection controller PSCTL_b.

The reading circuit 302_b is provided in the photodetection controller PSCTL_b.

The display driver circuit 303 is provided in the display controller DISPCTL.

The display data signal output circuit 304 is provided in the display controller DISPCTL.

The plurality of photodetector circuits 305p_b and the plurality of display circuits 305d are provided in the pixel portion PIX_b. Note that one or more display circuits 305d form one pixel in the semiconductor device illustrated in FIG. 4B. Alternatively, one pixel may be formed by one or more display circuits 305d and one or more photodetector circuits 305p_b.

Further, components of the semiconductor devices illustrated in FIGS. 4A and 4B will be described.

The photodetection driver circuit 301_a and the photodetection driver circuit 301_b are circuits for controlling photodetection operation. The photodetection driver circuit 301_a controls the photodetection operation of the photodetector circuit 305p_a, and the photodetection driver circuit 301_b controls the photodetection operation of the photodetector circuit 305p_b.

The photodetection driver circuit 301_a and the photodetection driver circuit 301_b each output at least a photodetection reset signal and an output selection signal which are pulse signals.

The photodetection driver circuit 301_a and the photodetection driver circuit 301_b each include, for example, at least two shill registers. In this case, the photodetection driver circuit 301_a and the photodetection driver circuit 301_b can each output a pulse signal from one of the two shift registers and thus output a photodetection reset signal, and can output a pulse signal from the other of the two shift registers and thus output an output selection signal.

The reading circuit 302_a and the reading circuit 302_b each have a function of reading optical data. The reading circuit 302_a reads optical data from the photodetector circuit 305p_a, and the reading circuit 302_b reads optical data from the photodetector circuit 305p_b.

The reading circuit 302_a and the reading circuit 302_b each include a selection circuit, for example. For example, the selection circuit includes a transistor and can read optical data when optical data is input to the selection circuit as an optical data signal in accordance with the transistor.

The display driver circuit 303 controls the display operation of the display circuit 305d.

The display driver circuit 303 includes, for example, a shill register. In this case, the display driver circuit 303 can output a plurality of pulse signals from the shift register, and thus can output a signal for controlling the display circuits 305d (e.g., a display selection signal (also referred to as a signal DSEL)). Alternatively, the display driver circuit 303 may include a plurality of shill registers. In this case, the display driver circuit 303 can output a plurality of pulse signals from each of the plurality of shift registers, and thus can output a plurality of signals for controlling the display circuits 305d.

The display data signal output circuit 304 is provided in the display controller DISPCTL. An image signal is input to the display data signal Output circuit 304. The display data signal output circuit 304 has a function of generating a display data signal (also referred to as a signal DD) that is a voltage signal on the basis of the input image signal and outputting the generated display data signal.

The display data signal output circuit 304 includes a plurality of transistors, for example.

The display data signal output circuit 304 can output the data of an input signal as a display data signal when the transistor is in the on state. The transistor can be controlled by inputting a control signal that is a pulse signal to a current control terminal. Note that in the case where the number of the display circuits 305*d* is more than one, a plurality of transistors may be selectively switched to the on state or the off state so that the data of image signals is output as a plurality of display data signals.

The photodetector circuit 305*p_a* and the photodetector circuit 305*p_b* each generate optical data that is a voltage having a value corresponding to the illuminance of incident light.

As the photodetector circuit 305*p_a* and the photodetector circuit 305*p_b*, any of the photodetector circuits described in Embodiments 1 and 2 can be used.

Note that it is also possible to generate the data of a full-color image signal by providing photodetector circuits receiving red light, photodetector circuits receiving green light, and photodetector circuits receiving blue light as the plurality of photodetector circuits 305*p_a* and the plurality of photodetector circuits 305*p_b*, generating optical data by these photodetector circuits, and combining the generated optical data of different colors. In addition to the above-described photodetector circuits, one or more photodetector circuits receiving light of one or more of the following colors: cyan, magenta, and yellow may be provided. By providing one or more photodetector circuits receiving light of one or more of the following colors: cyan, magenta, and yellow, the kind of colors that can be represented in a displayed image based on generated image signals can be increased. For example, by providing a coloring layer, which transmits light of a particular color, in a photodetector circuit and letting light in the photodetector circuit through the coloring layer, optical data that is a voltage having a value corresponding to the illuminance of light of a particular color can be generated.

A display data signal is input to each of the plurality of display circuits 305*d*. Each of the plurality of display circuits 305*d* changes its display state in accordance with the input display data signal.

As the display circuit 305*d*, a display circuit using a liquid crystal element, a display circuit using an electroluminescent (EL) element, or the like can be used, for example.

Note that it is also possible to display a full-color image in the pixel portion by providing a display circuit emitting red light, a display circuit emitting green light, and a display circuit emitting blue light and by making these display circuits emit light. In addition to the above-described display circuits, one or more display circuits emitting light of one or more of the following colors: cyan, magenta, and yellow may be provided. By providing one or more display circuits emitting light of one or more of the following colors: cyan, magenta, and yellow, the kind of colors that can be represented in a displayed image can be increased, so that the quality of the displayed image can be improved. For example, a light-emitting element and a coloring layer that transmits light of a particular color emitted from the light-emitting element are provided in a display circuit and light is emitted from the light-emitting element so as to pass the coloring layer, thereby achieving the emission of light of the particular color. This structure enables a full-color image to be displayed without forming a plurality of light-emitting elements emitting light of different colors, thereby facilitating the manufacturing process, enhancing yield, and improving the quality and reliability of the light-emitting elements.

Next, examples of methods for driving the semiconductor devices illustrated in FIGS. 4A and 4B will be described.

First, an example of a method for driving the semiconductor device illustrated in FIG. 4A is described.

In the semiconductor device illustrated in FIG. 4A, optical data that is a voltage corresponding to the illuminance of incident light is generated in the photodetector circuit 305*p_a*, and the optical data is output as an optical data signal.

Further, optical data output from the photodetector circuit 305*p_a* is read by the reading circuit 302*_a*. The read optical data is used for a predetermined process such as generation of image data of an object to be detected.

Next, an example of a method for driving the semiconductor device illustrated in FIG. 4B is described.

In the semiconductor device illustrated in FIG. 4B, the display circuits 305*d* are selected row by row by the display driver circuit 303, and display data signals are input sequentially to the display circuits 305*d* in each of the selected rows.

The display circuit 305*d* to which a display data signal has been input changes its display state in accordance with data of the input display data signal; thus, the pixel portion PIX_b displays an image.

In the semiconductor device illustrated in FIG. 4B, optical data that is a voltage corresponding to the illuminance of incident light is generated in the photodetector circuit 305*p_b*, and the optical data is output as an optical data signal.

For example when an object to be detected is over the pixel portion PIX_b, light emitted from the display circuit 305*d* is reflected by the object to be detected, and the reflected light enters the photodetector circuit 305*p_b*, so that optical data that is a voltage corresponding to the illuminance of incident light is generated in the photodetector circuit 305*p_b* and the optical data is output as an optical data signal.

Further, optical data output from the photodetector circuit 305*p_b* is read by the reading circuit 302*_b*. The read optical data is used for a predetermined process such as detection of the coordinates of an object to be detected or generation of image data of the object to be detected.

The above are the examples of the methods for driving the semiconductor devices illustrated in FIGS. 4A and 4B.

Next, examples of a display circuit in the semiconductor device illustrated in FIG. 4B will be described with reference to FIGS. 5A to 5D.

Figure 5A:
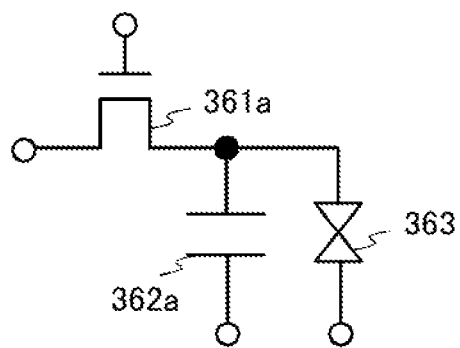
FIGS. 5A to 5D illustrate examples of a display circuit in a semiconductor device.

A display circuit illustrated in FIG. 5A includes a transistor 361*a*, a capacitor 362*a*, and a liquid crystal element 363.

Note that in the display circuit illustrated in FIG. 5A, the transistor 361*a* is a field-effect transistor.

A liquid crystal element includes at least a first display electrode, a second display electrode, and a liquid crystal layer overlapping with the first display electrode and the second display electrode. The light transmittance of the liquid crystal layer is changed in accordance with a voltage applied between the first display electrode and the second display electrode.

A signal DD is input to one of a source and a drain of the transistor 361*a*, and a signal DSEL is input to a gate of the transistor 361*a*.

A first capacitor electrode of the capacitor 362*a* is electrically connected to the other of the source and the drain of the transistor 361*a*. The voltage Vc is input to a second capacitor electrode of the capacitor 362*a*.

A first display electrode of the liquid crystal element 363 is electrically connected to the other of the source and the drain of the transistor 361*a*. The voltage Vc is input to a second display electrode of the liquid crystal element 363. The value of the voltage Vc can be set as appropriate.

Figure 5C:
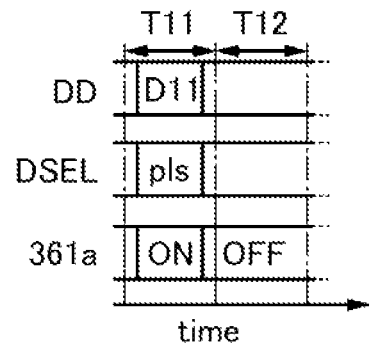
Figure 5B:
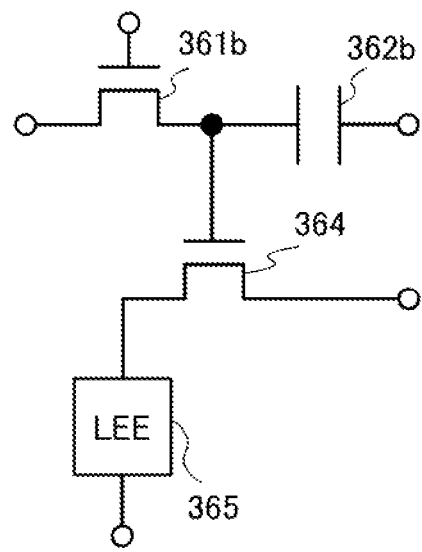

A display circuit illustrated in FIG. 5B includes a transistor 361b, a capacitor 362b, a transistor 364, and a light-emitting element (also referred to as LEE) 365.

Note that in the display circuit illustrated in FIG. 5B, the transistor 361b and the transistor 364 are field-effect transistors.

A light-emitting element includes a first current terminal, a second current terminal, and an electroluminescent layer overlapping with the first current terminal and the second current terminal. The light-emitting element emits light when current flows between the first current terminal and the second current terminal in accordance with a voltage applied between the first current terminal and the second current terminal.

A signal DD is input to one of a source and a drain of the transistor 361b, and a signal DSEL is input to a gate of the transistor 361b.

The voltage Vb is input to a first capacitor electrode of the capacitor 362b. A second capacitor electrode of the capacitor 362b is electrically connected to a gate of the transistor 364.

The voltage Vb is input to one of a source and a drain of the transistor 364. The gate of the transistor 364 is electrically connected to the other of, the source and the drain of the transistor 361b.

A first current terminal of the light-emitting element 365 is electrically connected to the other of the source and the drain of the transistor 364. The voltage Vb is input to a second current terminal of the light-emitting element 365.

Further, components of the display circuits illustrated in FIGS. 5A and 5B will be described.

The transistors 361a and 361b function as display selection transistors.

The capacitors 362a and 362b each function as a storage capacitor in which voltage having a value corresponding to the signal DD is applied between the first capacitor electrode and the second capacitor electrode.

As a liquid crystal layer in the liquid crystal element 363, for example, a liquid crystal layer that transmits light when a voltage applied between the first display electrode and the second display electrode is 0 V can be used. For example, it is possible to use a liquid crystal layer including electrically controlled birefringence-liquid crystal (ECB liquid crystal), liquid crystal to which dichroic dye is added (GH liquid crystal), polymer-dispersed liquid crystal, or discotic liquid crystal. A liquid crystal layer exhibiting a blue phase may be used as the liquid crystal layer. The liquid crystal layer exhibiting a blue phase contains, for example, a liquid crystal composition including a liquid crystal exhibiting a blue phase and a chiral agent. The liquid crystal exhibiting a blue phase has a short response time of 1 msec or less, and is optically isotropic; thus, alignment treatment is not necessary and viewing angle dependence is small. Thus, with the liquid crystal exhibiting a blue phase, operation speed can be improved.

The transistor 364 is a driving transistor.

Note that each of the transistors 361a, 361b, and 364 can be, for example, a transistor including a semiconductor layer containing a semiconductor that belongs to Group 14 in the periodic table (e.g., silicon) or an oxide semiconductor layer in which a channel is formed.

An EL element, a light-emitting diode, a light-emitting transistor, or the like can be used as the light-emitting element 365. In the case of using an EL element, one of an anode and a cathode of the EL element corresponds to the first current terminal of the light-emitting element, and the other corresponds to the second current terminal of the light-emitting element.

Next, examples of methods for driving the display circuits illustrated in FIGS. 5A and 5B will be described.

First, the example of the method for driving the display circuit illustrated in FIG. 5A is described with reference to FIG. 5C. FIG. 5C is a timing chart for describing the example of the method for driving the display circuit illustrated in FIG. 5A, and illustrates the states of the signal DD, the signal DSEL, and the transistor 361a.

In the example of the method for driving the display circuit in FIG. 5A, in a period T11, a pulse of the signal DSEL is input, so that the transistor 361a is in the on state.

When the transistor 361a is in the on state, the signal DD is input to the display circuit, so that the voltage of the first display electrode of the liquid crystal element 363 and the voltage of the first capacitor electrode of the capacitor 362a become equivalent to the voltage of the signal DD (a voltage D11 here).

At this time, the liquid crystal element 363 has a light transmittance corresponding to the signal DD, so that the display circuit is placed in a display state corresponding to data of the signal DD.

In addition, after the input of the pulse of the signal DSEL ends, the transistor 361a switches to the off state. This is the example of the method for driving the display circuit illustrated in FIG. 5A.

Figure 5D:
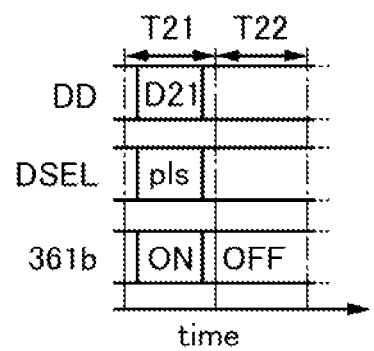

Next, the example of the method for driving the display circuit illustrated in FIG. 5B is described with reference to FIG. 5D. FIG. 5D is a timing chart for describing the example of the method for driving the display circuit illustrated in FIG. 5B, and illustrates the states of the signal DD, the signal DSEL, and the transistor 361b.

In the example of the method for driving the display circuit in FIG. 5B, in a period T21, a pulse of the signal DSEL is input, so that the transistor 361b is in the on state.

When the transistor 361b is in the on state, the signal DD is input to the display circuit, so that the voltage of the gate of the transistor 364 and the voltage of the second capacitor electrode of the capacitor 362b become equivalent to the voltage of the signal DD (a voltage D21 here, for example).

At this time, current flows between the source and the drain of the transistor 364 in accordance with the voltage of the gate of the transistor 364, and current flows between the first current terminal and the second current terminal of the light-emitting element 365, so that the light-emitting element 365 emits light. At this time, the voltage of the first current terminal of the light-emitting element 365 becomes a value corresponding to the voltage of the signal DD (here, the voltage D21) and the luminance of the light-emitting element 365 becomes a value corresponding to the voltage Vb and the voltage of the first current terminal set in accordance with the signal DD.

In addition, after the input of the pulse of the signal DSEL ends, the transistor 361b switches to the off state. This is the example of the method for driving the display circuit illustrated in FIG. 5B.

As described with reference to FIGS. 5A and 5B, the examples of the display circuit in the semiconductor device of this embodiment each have a structure in which a display selection transistor and a display element are provided. With the above structure, the display circuit can be placed in a display state corresponding to a display data signal.

The above are the examples of the display circuit in the semiconductor device illustrated in FIG. 4B.

Next, structural examples of the display circuit in the semiconductor device illustrated in FIG. 4B and the photodetector circuits in the semiconductor devices illustrated in FIGS. 4A and 4B will be described. Here, a semiconductor device including the display circuit illustrated in FIG. 5A will be described as an example of the semiconductor device illustrated in FIG. 4B.

The semiconductor device in FIG. 4A includes a substrate (an element substrate) provided with a semiconductor element such as a transistor.

The semiconductor device in FIG. 4B includes a first substrate (an element substrate) provided with a semiconductor element such as a transistor; a second substrate, and a liquid crystal layer provided between the first substrate and the second substrate.

Figure 6A:
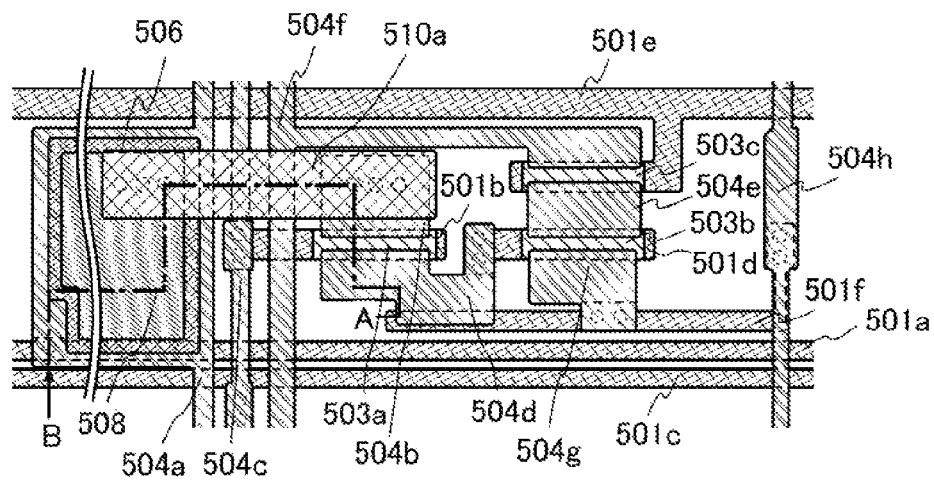
FIGS. 6A and 6B illustrate a structural example of an element substrate in a semiconductor device.
Figure 6B:
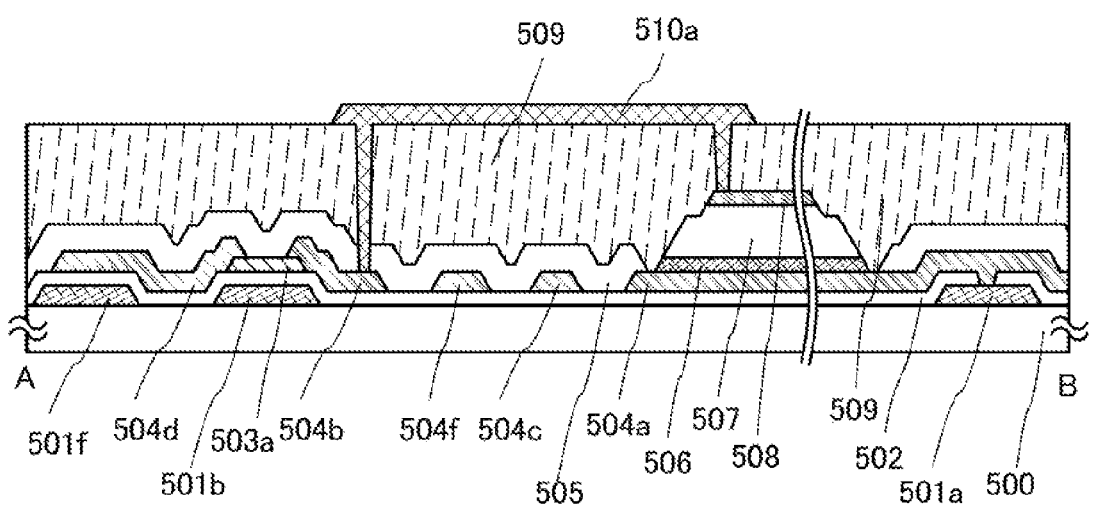
Figure 7A:
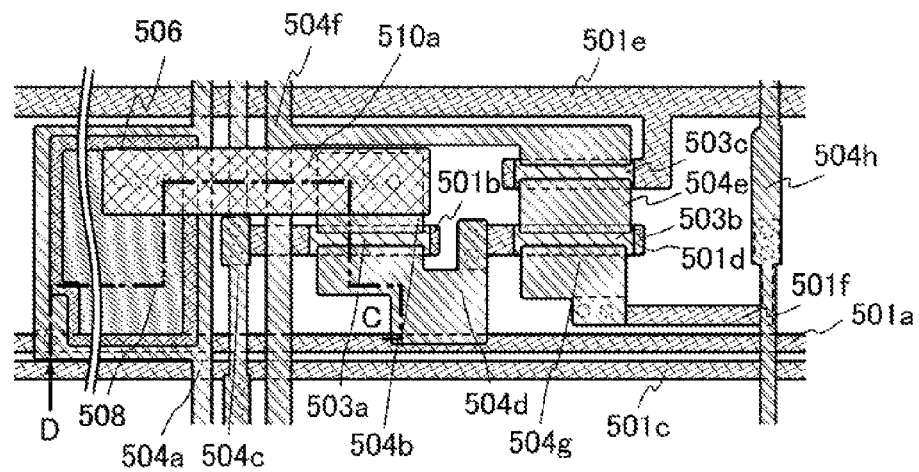
FIGS. 7A and 7B illustrate a structural example of an element substrate in a semiconductor device.
Figure 7B:
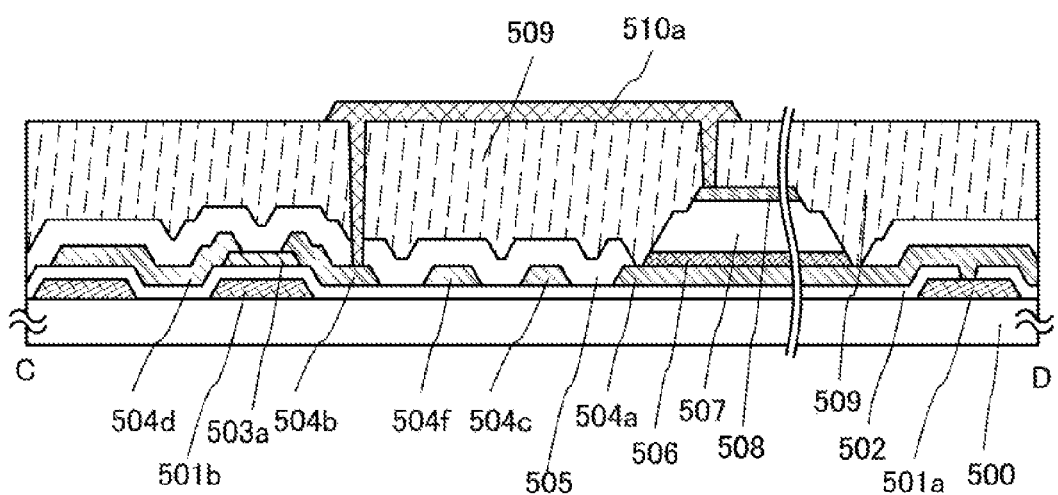
Figure 8A:
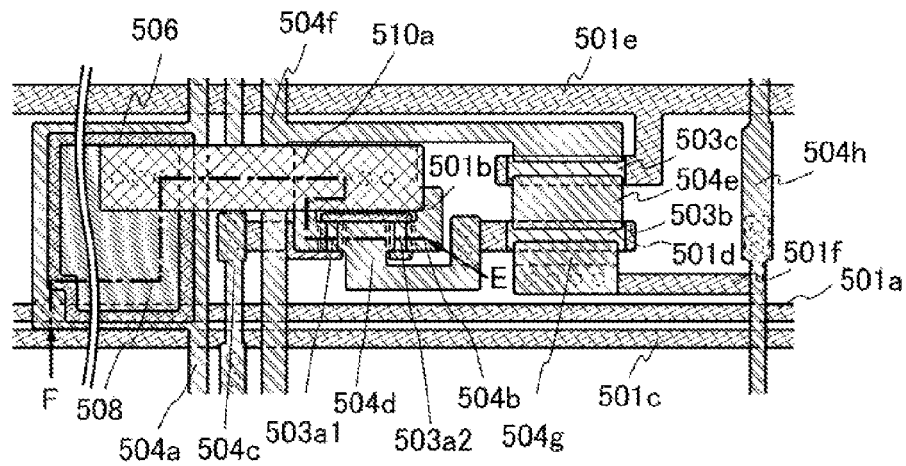
FIGS. 8A and 8B illustrate a structural example of an element substrate in a semiconductor device.
Figure 8B:
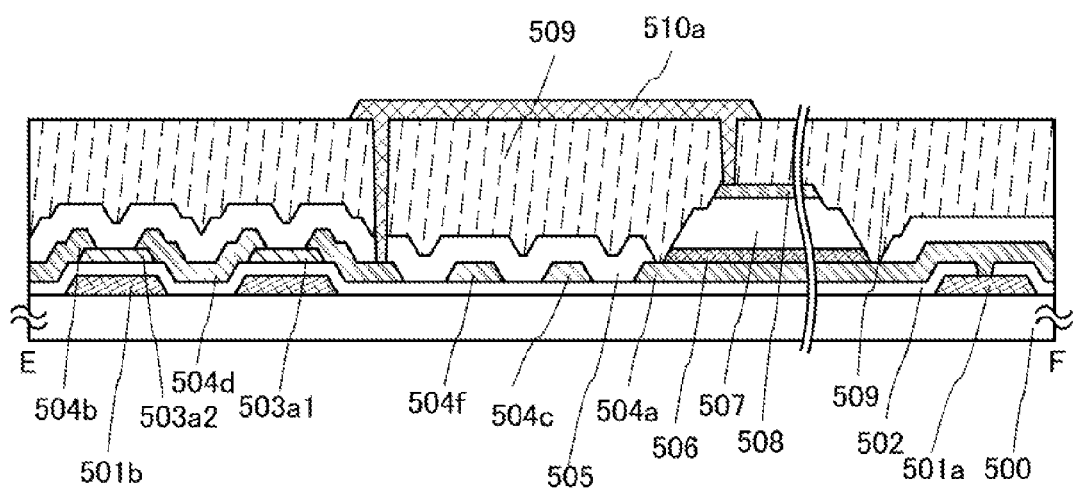
Figure 9A:
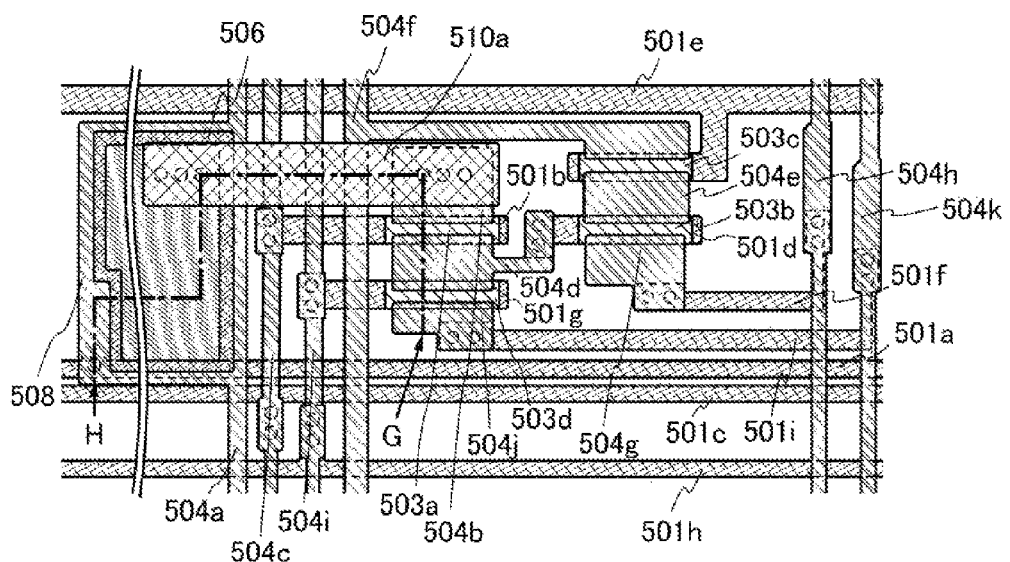
FIGS. 9A and 9B illustrate a structural example of an element substrate in a semiconductor device.
Figure 9B:
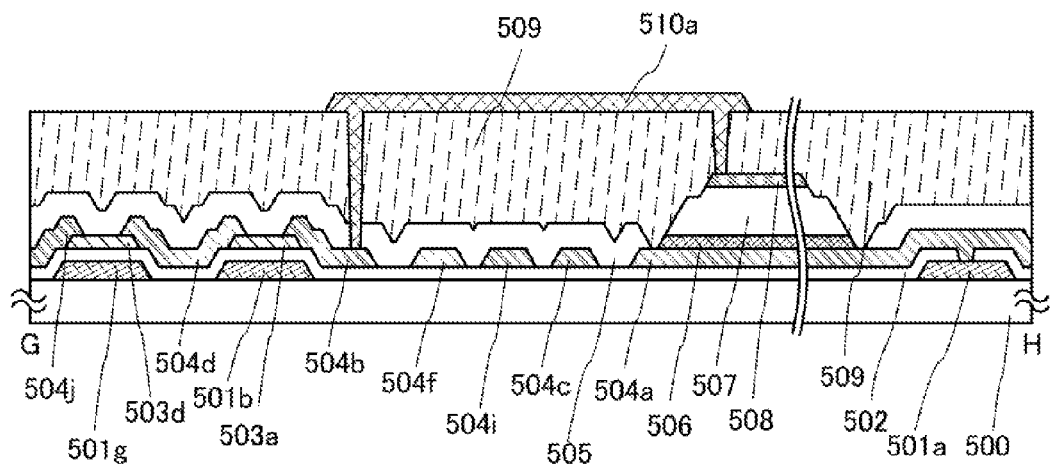
Figure 10A:
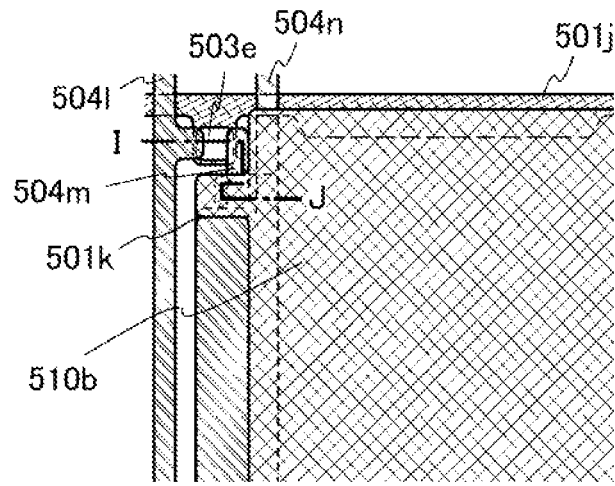
FIGS. 10A and 10B illustrate a structural example of an element substrate in a semiconductor device.
Figure 10B:
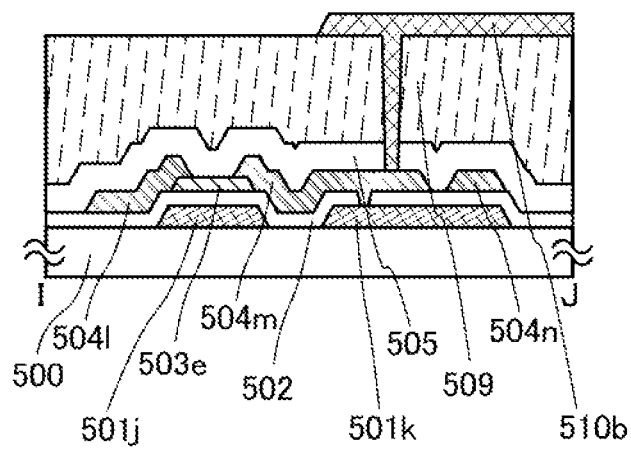

Further, structural examples of the element substrate in the semiconductor device of this embodiment are described with reference to FIGS. 6A and 6B, FIGS. 7A and 7B, FIGS. 8A and 8B, FIGS. 9A and 9B, and FIGS. 10A and 10B. FIGS. 6A and 6B, FIGS. 7A and 7B, FIGS. 8A and 8B, FIGS. 9A and 9B, and FIGS. 10A and 10B illustrate the structural examples of the element substrate in the semiconductor device of this embodiment. FIG. 6A is a schematic plan view, and FIG. 6B is a schematic cross-sectional view taken along line A-B in FIG. 6A. FIG. 7A is a schematic plan view, and FIG. 7B is a schematic cross-sectional view taken along line C-D in FIG. 7A. FIG. 8A is a schematic plan view, and FIG. 8B is a schematic cross-sectional view taken alone line E-F in FIG. 8A. FIG. 9A is a schematic plan view, and FIG. 9B is a schematic cross-sectional view taken along line G-H in FIG. 9A. FIG. 10A is a schematic plan view, and FIG. 10B is a schematic cross-sectional view taken along line I-J in FIG. 10A.

The element substrate in the semiconductor device illustrated in FIG. 4A includes a substrate 500, conductive layers 501a to 501f; an insulating layer 502, semiconductor layers 503a to 503c, conductive layers 504a to 504h, an insulating layer 505, a semiconductor layer 506, a semiconductor layer 507, a semiconductor layer 508, an insulating layer 509, and a conductive layer 510a, as illustrated in FIGS. 6A and 6B.

The conductive layers 501a to 501f are formed over one surface of the substrate 500.

The conductive layer 501a functions as a signal line through which a photodetection reset signal is input.

The conductive layer 501b functions as a gate of a charge accumulation control transistor in the photodetector circuit. Note that such a conductive layer functioning as a gate of a transistor is also referred to as a gate electrode or a gate wiring.

The conductive layer 501c functions as a signal line through which a charge accumulation control signal is input.

The conductive layer 501d functions as a gate of an amplifier transistor in the photodetector circuit.

The conductive layer 501e functions as a gate of an output selection transistor in the photodetector circuit.

The conductive layer 501f functions as a first capacitor electrode of a storage capacitor in the photodetector circuit described in Embodiment 3 and as a wiring through which the voltage Va or the voltage Vb is input.

The insulating layer 502 is provided over the one surface of the substrate 500 with the conductive layers 501a to 501f interposed therebetween.

The insulating layer 502 functions as a gate insulating layer of the charge accumulation control transistor in the photodetector circuit, a gate insulating layer of the amplifier transistor in the photodetector circuit, a gate insulating layer of the output selection transistor in the photodetector circuit, and a dielectric layer of the storage capacitor in the photodetector circuit described in Embodiment 3.

The semiconductor layer 503a overlaps with the conductive layer 501b with the insulating layer 502 interposed therebetween. The semiconductor layer 503a functions as a channel formation layer of the charge accumulation control transistor in the photodetector circuit.

The semiconductor layer 503b overlaps with the conductive layer 501d with the insulating layer 502 interposed therebetween. The semiconductor layer 503b functions as a channel formation layer of the amplifier transistor in the photodetector circuit.

The semiconductor layer 503c overlaps with the conductive layer 501e with the insulating layer 502 interposed therebetween. The semiconductor layer 503c functions as a channel formation layer of the output selection transistor in the photodetector circuit.

The conductive layer 504a is electrically connected to the conductive layer 501a through an opening that penetrates the insulating layer 502. The conductive layer 504a functions as a first current terminal of a photoelectric conversion element in the photodetector circuit.

The conductive layer 504b is electrically connected to the semiconductor layer 503a. The conductive layer 504b functions as one of a source and a drain of the charge accumulation control transistor in the photodetector circuit. Note that a conductive layer functioning as a source of a transistor is also referred to as a source electrode or a source wiring, and a conductive layer functioning as a drain of a transistor is also referred to as a drain electrode or a drain wiring.

The conductive layer 504c is electrically connected to the conductive layer 501b and the conductive layer 501c through openings that penetrate the insulating layer 502. The conductive layer 504c functions as a signal line through which a charge accumulation control signal is input.

The conductive layer 504d is electrically connected to the semiconductor layer 503a and is electrically connected to the conductive layer 501d through an opening that penetrates the insulating layer 502. One of a pair of facing side surfaces of the conductive layer 504d overlaps with the conductive layer 501b with the insulating layer 502 interposed therebetween, and the other of the pair of facing side surfaces of the conductive layer 504d overlaps with the conductive layer 501f with the insulating layer 502 interposed therebetween. The conductive layer 501f, the insulating layer 502, and the conductive layer 504d form the storage capacitor in the photodetector circuit described in Embodiment 3. The conductive layer 504d functions as the other of the source and the drain of the charge accumulation control transistor in the photodetector circuit and as a second capacitor electrode of the storage capacitor in the photodetector circuit described in Embodiment 3.

The conductive layer 504e is electrically connected to the semiconductor layer 503b and the semiconductor layer 503c. The conductive layer 504e functions as one of a source and a drain of the output selection transistor in the photodetector circuit and as one of a source and a drain of the amplifier transistor in the photodetector circuit.

The conductive layer 504f is electrically connected to the semiconductor layer 503c. The conductive layer 504f functions as the other of the source and the drain of the output selection transistor in the photodetector circuit.

The conductive layer 504g is electrically connected to the semiconductor layer 503b and is electrically connected to the conductive layer 501f through an opening that penetrates the insulating layer 502. The conductive layer 504g functions as the other of the source and the drain of the amplifier transistor in the photodetector circuit.

The conductive layer 504h is electrically connected to the conductive layer 501f through an opening that penetrates the insulating layer 502. The conductive layer 504h functions as a wiring through which the voltage Va or the voltage Vb is input.

The insulating layer 505 is in contact with the semiconductor layers 503a to 503c with the conductive layers 504a to 504h interposed therebetween.

The semiconductor layer 506 is electrically connected to the conductive layer 504a through an opening that penetrates the insulating layer 505.

The semiconductor layer 507 is in contact with the semiconductor layer 506.

The semiconductor layer 508 is in contact with the semiconductor layer 507.

The insulating layer 509 overlaps with the insulating layer 505, the semiconductor layer 506, the semiconductor layer 507, and the semiconductor layer 508. The insulating layer 509 functions as a planarization insulating layer.

The conductive layer 510a is electrically connected to the conductive layer 504b through an opening that penetrates the insulating layers 505 and 509 and is electrically connected to the semiconductor layer 508 through an opening that penetrates the insulating layers 505 and 509.

Modification examples of the element substrate illustrated in FIGS. 6A and 6B will be described with reference to FIGS. 7A and 7B, FIGS. 8A and 8B, and FIGS. 9A and 9B.

An element substrate illustrated in FIGS. 7A and 7B has a structure in which the other of the pair of facing side surfaces of the conductive layer 504d illustrated in FIGS. 6A and 6B overlaps with the conductive layer 501a instead of the conductive layer 501f, with the insulating layer 502 interposed therebetween. In the element substrate illustrated in FIGS. 7A and 7B, the conductive layer 501a, the insulating layer 502, and the conductive layer 504d form the storage capacitor in the photodetector circuit described in Embodiment 3. Note that the other structures are the same as those of the element substrate illustrated in FIGS. 6A and 6B; thus, for description of the other structures, the description of the element substrate in FIGS. 6A and 6B can be referred to as appropriate.

An element substrate illustrated in FIGS. 8A and 8B has a structure in which semiconductor layers 503a1 and 503a2 are provided instead of the semiconductor layer 503a illustrated in FIGS. 6A and 6B. In this case, the semiconductor layers 503a1 and 503a2 overlap with the conductive layer 501b with the insulating layer 502 interposed therebetween, the conductive layer 501b is electrically connected to the semiconductor layers 503a1 and 503a2 instead of the semiconductor layer 503a, and the conductive layer 504d is electrically connected to the semiconductor layers 503a1 and 50302 instead of the semiconductor layer 503a. The pair of facing side surfaces of the conductive layer 504d overlaps with the conductive layer 501b with the insulating layer 502 interposed therebetween. With the above structure, the photodetector circuit described in Embodiment 1 can be formed. Note that the other structures are the same as those of the element substrate illustrated in FIGS. 6A and 6B; thus, for description of the other structures, the description of the element substrate in FIGS. 6A and 6B can be referred to as appropriate.

An element substrate illustrated in FIGS. 9A and 9B has a structure which includes conductive layers 501g to 501f, a semiconductor layer 503d, and conductive layers 504i to 504k in addition to the structure illustrated in FIGS. 6A and 6B.

The conductive layers 501g to 501f are provided over the one surface of the substrate 500, similarly to the conductive layers 501a to 501f.

The conductive layer 501g functions as a gate of a photodetection reset transistor in the photodetector circuit, described in Embodiment 2.

The conductive layer 501h functions as a signal line through which a photodetection reset signal in the photodetector circuit described in Embodiment 2 is input.

The conductive layer 501i functions as a wiring through which the voltage Va is supplied.

The insulating layer 502 is also provided over the conductive layers 501g to 501i. Here, the insulating layer 502 functions as a gate insulating layer of the photodetection reset transistor in the photodetector circuit described in Embodiment 2.

The semiconductor layer 503d overlaps with the conductive layer 501a with the insulating layer 502 interposed therebetween.

The semiconductor layer 503d functions as a channel formation layer of the photodetection reset transistor in the photodetector circuit described in Embodiment 2.

The conductive layer 504i is electrically connected to the conductive layer 501g and the conductive layer 501h through openings that penetrate the insulating layer 502.

The conductive layer 504i functions as a signal line through which a photodetection reset signal is supplied.

The conductive layer 504j is electrically connected to the semiconductor layer 503d and is electrically connected to the conductive layer 501i through an opening that penetrates the insulating layer 502.

The conductive layer 504j functions as one of a source and a drain of the photodetection reset transistor in the photodetector circuit described in Embodiment 2.

The conductive layer 504k is electrically connected to the conductive layer 501i through an opening that penetrates the insulating layer 502.

The conductive layer 504k functions as a wiring through which the voltage Va is supplied.

In FIGS. 9A and 9B, the conductive layer 504d is electrically connected to the semiconductor layer 503d in addition to the semiconductor layer 503a. Here, the conductive layer 504d functions as the other of the source and the drain of the charge accumulation control transistor in the photodetector circuit and as the other of the source and the drain of the photodetection reset transistor in the photodetector circuit described in Embodiment 2.

The one of the pair of facing side surfaces of the conductive layer 504d overlaps with the conductive layer 501b with the insulating layer 502 interposed therebetween, and the other of the pair of side surfaces overlaps with the conductive layer 501g with the insulating layer 502 interposed therebetween. With the above structure, the photodetector circuit described in Embodiment 2 can be formed. Note that the other structures are the same as those of the element substrate illustrated in FIGS. 6A and 6B; thus, for description of the other structures, the description of the element substrate in FIGS. 6A and 6B can be referred to as appropriate.

The element substrate in the semiconductor device illustrated in FIG. 4B includes, as illustrated in FIGS. 10A and 10B, a conductive layer 501j, a conductive layer 501k, a semiconductor layer 503e, conductive layers 504l to 504n, and a conductive layer 510b in addition to any one of the structures in FIGS. 6A and 6B, FIGS. 7A and 7B, FIGS. 8A and 8B, and FIGS. 9A and 9B.

The conductive layers 501*j* and 501*k* are provided over the one surface of the substrate 500, similarly to the conductive layers 501*a* to 501*i*.

The conductive layer 501*j* functions as a gate of a display selection transistor in a display circuit.

The conductive layer 501*k* functions as a first capacitor electrode of a storage capacitor in the display circuit.

The insulating layer 502 is also provided over the conductive layers 501*j* and 501*k*.

The semiconductor layer 503*e* overlaps with the conductive layer 501*j* with the insulating layer 502 interposed therebetween. The semiconductor layer 503*e* functions as a channel formation layer of the display selection transistor in the display circuit.

The conductive layer 504*l* is electrically connected to the semiconductor layer 503*e*. The conductive layer 504*l* functions as one of a source and a drain of the display selection transistor in the display circuit.

The conductive layer 504*m* is electrically connected to the semiconductor layer 503*e* and is electrically connected to the conductive layer 501*k* through an opening that penetrates the insulating layer 502. The conductive layer 504*m* functions as the other of the source and the drain of the display selection transistor in the display circuit.

The conductive layer 504*n* overlaps with the conductive layer 501*k* with the insulating layer 502 interposed therebetween. The conductive layer 504*n* functions as a second capacitor electrode of the storage capacitor in the display circuit.

In the semiconductor device illustrated in FIGS. 10A and 10B, the insulating layer 505 is also provided in contact with the semiconductor layer 503*e*.

The conductive layer 510*b* is electrically connected to the conductive layer 504*m* through an opening that penetrates the insulating layers 505 and 509. Providing the conductive layer 510*b* over the conductive layer 501*j* can prevent light leakage. The conductive layer 510*b* functions as a pixel electrode of a display element in the display circuit. Note that a layer having a function of a pixel electrode can be referred to as a pixel electrode.

Next, a structural example of the semiconductor device illustrated in FIG. 4B will be described with reference to FIG. 11. FIG. 11 is a cross-sectional schematic view illustrating the structural example of the semiconductor device in this embodiment.

The semiconductor device in FIG. 4B includes, as illustrated in FIG. 11, a substrate 512, an insulating layer 516, a conductive layer 517, and a liquid crystal layer 518 in addition to the element substrate including any one of the structures in FIGS. 6A and 6B, FIGS. 7A and 7B, FIGS. 8A and 8B, and FIGS. 9A and 9B and the structure in FIGS. 10A and 10B.

The insulating layer 516 is provided on one surface of the substrate 512.

The conductive layer 517 is provided on the one surface of the substrate 512. The conductive layer 517 functions as a common electrode in the display circuit. Note that in the photodetector circuit, the conductive layer 517 is not necessarily provided.

The liquid crystal layer 518 is provided between the conductive layer 510*b* and the conductive layer 517.

Note that the conductive layer 510*b*, the liquid crystal layer 518, and the conductive layer 517 function as a display element in the display circuit.

In addition, a coloring layer may be provided on the one surface of the substrate 512.

Further, components of the semiconductor devices illustrated in FIGS. 6A and 6B, FIGS. 7A and 7B, FIGS. 8A and 8B, FIGS. 9A and 9B, FIGS. 10A and 10B, and FIG. 11 will be described.

Each of the substrates 500 and 512 can be, for example, a light-transmitting substrate such as a glass substrate or a plastic substrate.

Each of the conductive layers 501*a* to 501*k* can be a layer of a material applicable to the conductive layer 121 illustrated in FIGS. 1A to 1F, for example. The conductive layers 501*a* to 501*k* can also be formed by stacking layers of materials applicable to the conductive layers 501*a* to 501*k*.

The insulating layer 502 can be a layer of a material applicable to the insulating layer 122 illustrated in FIGS. 1A to 1F, for example. The insulating layer 502 can also be formed by stacking layers of materials applicable to the insulating layer 502.

Each of the semiconductor layers 503*a* to 503*e* can be a layer of a material applicable to the semiconductor layers 123*a* and 123*b* illustrated in FIGS. 1A to 1F, for example.

Note that in the case of forming the semiconductor layers 503*a* to 503*e* by heat treatment, a heat treatment apparatus for the heat treatment can be an electric furnace or an apparatus for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

Further, when the semiconductor layers 503*a* to 503*e* are formed, the element substrate may be placed under reduced pressure and heated at a temperature higher than or equal to 100° C. and lower than or equal to 600° C., preferably higher than or equal to 200° C. and lower than or equal to 400° C. By heating the element substrate, the impurity concentration in the oxide semiconductor film can be lowered and damage to the oxide semiconductor film due to sputtering can be reduced.

In the case where each of the semiconductor layers 503*a* to 503*e* is an oxide semiconductor layer, the carrier concentration of the oxide semiconductor layer can be lower than $1 \times 10^{14}/cm^3$, preferably lower than $1 \times 10^{12}/cm^3$, further preferably lower than $1 \times 10^{11}/cm^3$, and thus, change in characteristics due to temperature change can be suppressed. In addition, when a channel formation layer of a transistor is formed using the above-described oxide semiconductor layer, the off-state current per micrometer of channel width can be 10 aA ($1 \times 10^{-17}$ A) or less, 1 aA ($1 \times 10^{-18}$ A) or less, 10 zA ($1 \times 10^{-20}$ A) or less, 1 zA ($1 \times 10^{-21}$ A) or less, or 100 yA ($1 \times 10^{-22}$ A) or less. It is preferable that the old state current of the transistor be as low as possible. The lower limit of the off-state current per micrometer of channel width of the transistor in this embodiment is estimated at about $10^{-30}$ A/μm.

Each of the conductive layers 504*a* to 504*n* can be a layer of a material applicable to the conductive layers 501*a* to 501*k*. The conductive layers 504*a* to 504*n* can also be formed by stacking layers of materials applicable to the conductive layers 504*a* to 504*n*.

The insulating layer 505 can be a layer of a material applicable to the insulating layer 502. The insulating layer 505 can also be formed by stacking layers of materials applicable to the insulating layer 505.

The semiconductor layer 506 is a one-conductivity-type (either p-type or n-type) semiconductor layer. As the semiconductor layer 506, a semiconductor layer containing silicon can be used, for example.

The semiconductor layer 507 has higher resistance than the semiconductor layer 506. As the semiconductor layer 507, a semiconductor layer containing silicon can be used, for example.

The semiconductor layer 508 is a semiconductor layer whose conductivity type is different from that of the semiconductor layer 506 (i.e., the other of p-type and n-type semiconductor layer). As the semiconductor layer 508, a semiconductor layer containing silicon can be used, for example.

As each of the insulating layers 509 and 516, for example, a layer of an organic material such as polyimide, acrylic, or benzocyclobutene can be used. Alternatively, as the insulating layer 509, a layer of a low-dielectric constant material (also referred to as a low-k material) can be used.

Each of the conductive layers 510a, 510b, and 517 is, for example, a layer of a light-transmitting conductive material such as indium tin oxide, a metal oxide in which zinc oxide is mixed in indium oxide, a conductive material in which silicon oxide ($SiO_2$) is mixed in indium oxide, organoindium, organotin, indium oxide containing tungsten oxide, indium zinc oxide containing tungsten oxide, indium oxide containing titanium oxide, or indium tin oxide containing titanium oxide.

The conductive layers 510a, 510b, and 517 can be formed using a conductive composition containing a conductive high molecule (also referred to as a conductive polymer). A conductive layer formed using the conductive composition preferably has a sheet resistance of 10000 ohms or less per square and a transmittance of 70% or more at a wavelength of 550 nm. Furthermore, the resistivity of the conductive high molecule contained in the conductive composition is preferably 0.1Ω·cm or less.

As the conductive high molecule, a so-called π-electron conjugated conductive high molecule can be used. As the π-electron conjugated conductive high molecule, polyaniline or a derivative thereof, polypyrrole or a derivative thereof, polythiophene or a derivative thereof, or a copolymer of two or more of aniline, pyrrole, and thiophene or a derivative thereof can be given.

As the light-blocking layer 513, a layer of a metal material can be used, for example.

The liquid crystal layer 518 can be, for example, a layer containing a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like. Note that for the liquid crystal layer 518, a liquid crystal that transmits light when voltage applied between the conductive layer 510b and the conductive layer 517 is 0 V is preferably used.

As described with reference to FIGS. 6A and 6B, FIGS. 7A and 7B, FIGS. 8A and 8B, FIGS. 9A and 9B, FIGS. 10A and 10B, and FIG. 11, in a structural example of the semiconductor device in this embodiment, a photodetector circuit is provided over a substrate.

Further, in another structural example of the semiconductor device in this embodiment, a display circuit is provided over the same substrate as the photodetector circuit.

With such a structure, in an input/output device, for example, a display circuit and a photodetector circuit can be provided over one substrate; thus, manufacturing cost can be reduced.

In each of the structural examples of the semiconductor device in this embodiment, a first conductive layer functioning as the other of the source and the drain of the charge accumulation control transistor, an insulating layer, and another conductive layer overlapping with the first conductive layer with the insulating layer interposed therebetween (e.g., a conductive layer functioning as a wiring or a signal line through which voltage is supplied) form a storage capacitor in the photodetector circuit. With the above structure, the storage capacitor in the photodetector circuit in Embodiment 2 can be formed without additionally providing a conductive layer; thus, an increase in the area of the photodetector circuit can be suppressed.

Embodiment 5

In this embodiment, the Field-effect mobility of a transistor which can be used for any of the photodetector circuits described in the above embodiments will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating layer. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu V_g V_d C_{ox}}{L}\exp\left(-\frac{E}{kT}\right) \qquad \text{[FORMULA 4]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} \qquad \text{[FORMULA 5]}$$
$$= \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The detect density N of an oxide semiconductor in which the ratio of indium (In), tin (Sn), and zinc (Zn) is 1:1:1 is approximately $1\times10^{12}/Cm^2$.

On the basis of the defect density etc., obtained in this manner, $\mu_0$ can be calculated to be 120 cm$^2$/Vs from Formula 2 and Formula 3. The measured mobility of an In—Sn—Zn oxide including a defect is approximately 40 cm$^2$/Vs. However, assuming that no defect exists inside the semiconductor and at the interface between the semiconductor and an insulating layer, the mobility $\mu_o$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{l}\right) \qquad \text{[FORMULA 6]}$$

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of Formula 6 is increased and accordingly the mobility $\mu_1$ is decreased.

Figure 16:
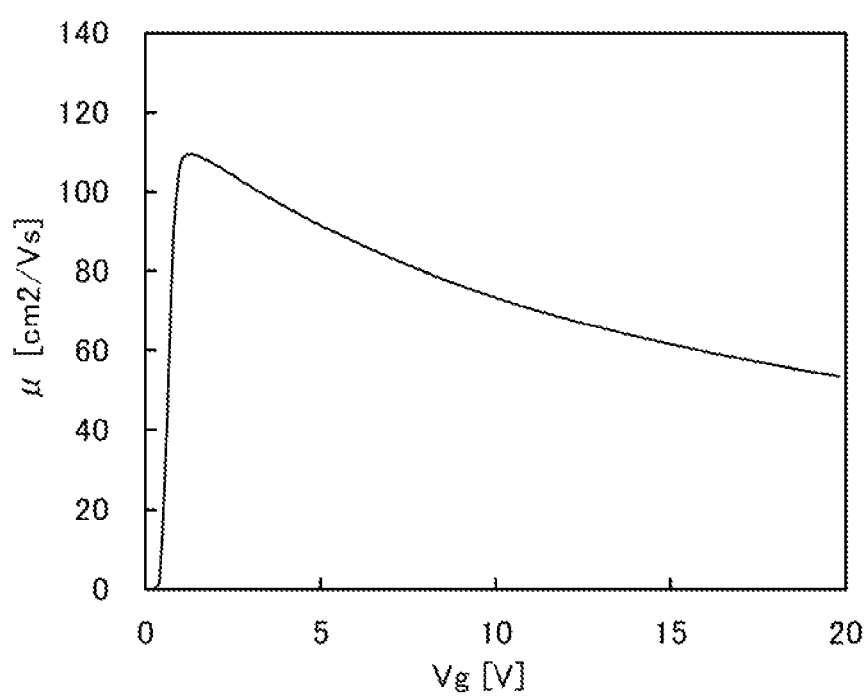
FIG. 16 shows gate voltage dependence of mobility obtained by calculation.

FIG. 16 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 1 V.

As shown in FIG. 16, the mobility has a peak of more than 100 cm$^2$/Vs at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a semiconductor region 1103a and a semiconductor region 1103c that have n$^+$-type conductivity in an oxide semiconductor layer. The resistivities of the semiconductor region 1103a and the semiconductor region 1103c are $2\times10^{-3}$ Ω·cm.

The transistor in FIG. 20A is formed, over a base insulating film 1101 and an embedded insulator 1102 that is embedded in the base insulating film 1101 and formed of aluminum oxide. The transistor includes the semiconductor region 1103a, the semiconductor region 1103c, an intrinsic semiconductor region 1103b serving as a channel formation region therebetween, and a gate 1105. The width of the gate 1105 is 33 nm.

A gate insulating layer 1104 is formed between the gate 1105 and the semiconductor region 1103b. In addition, a sidewall insulator 1106a and a sidewall insulator 1106b are formed on both side surfaces of the gate 1105, and an insulator 1107 is formed over the gate 1105 so as to prevent a short circuit between the gate 1105 and another wiring. The sidewall insulator has a width of 5 nm. A source 1108a and a drain 1108b are provided in contact with the semiconductor region 1103a and the semiconductor region 1103c, respectively. Note that the channel width of this transistor is 40 nm.

The transistor in FIG. 20B is the same as the transistor in FIG. 20A in that it is formed over the base insulating film 1101 and the embedded insulator 1102 formed of aluminum oxide and that it includes the semiconductor region 1103a, the semiconductor region 1103c, the intrinsic semiconductor region 1103b provided therebetween, the gate 1105 having a width of 33 nm, the gate insulating layer 1104, the sidewall insulator 1106a, the sidewall insulator 1106b, the insulator 1107, the source 1108a, and the drain 1108b.

The transistor illustrated in FIG. 20A is different from the transistor illustrated in FIG. 20B in the conductivity type of semiconductor regions under the sidewall insulator 1106a and the sidewall insulator 1106b. In the transistor illustrated in FIG. 20A, the semiconductor regions under the sidewall insulator 1106a and the sidewall insulator 1106b are part of the semiconductor region 1103a having n$^+$-type conductivity and part of the semiconductor region 1103c having n$^+$-type conductivity, whereas in the transistor illustrated in FIG. 20B, the semiconductor regions under the sidewall insulator 1106a and the sidewall insulator 1106b are part of the intrinsic semiconductor region 1103b. In other words, a region having a width of $L_{off}$ which overlaps with neither the semiconductor region 1103a (the semiconductor region 1103c) nor the gate 1105 is provided. This region is called an offset region, and the width $L_{off}$ is called an offset length. As is seen from the drawing, the offset length is equal to the width of the sidewall insulator 1106a (the sidewall insulator 1106b).

Figure 17A:
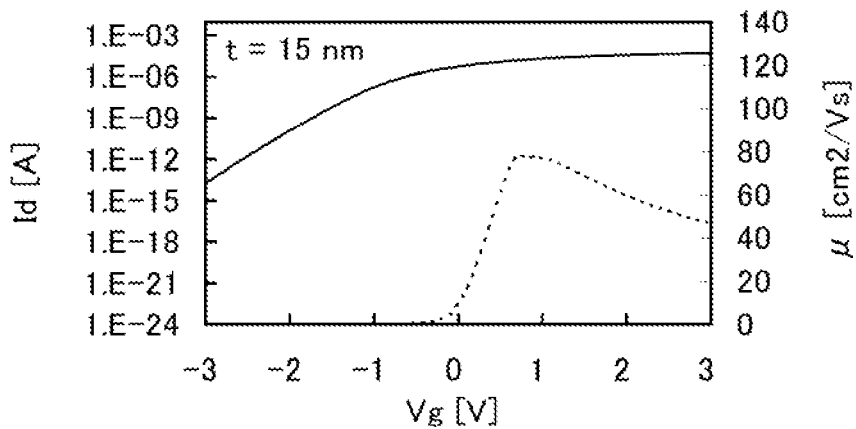
FIGS. 17A to 17C show the gate voltage dependence of drain current and mobility obtained by calculation.
Figure 17B:
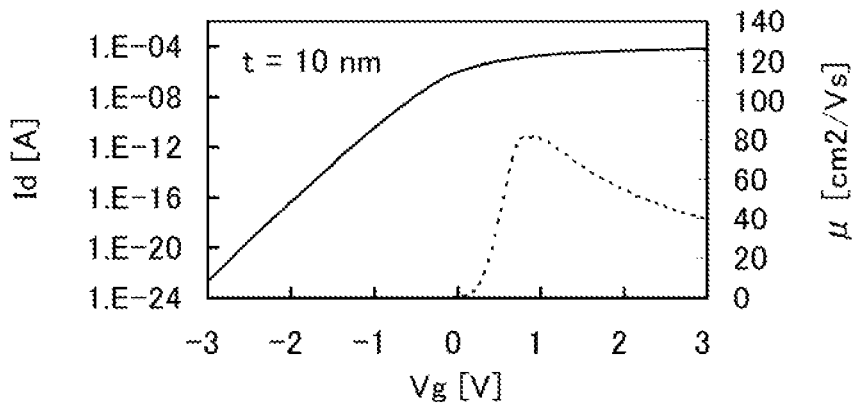
Figure 17C:
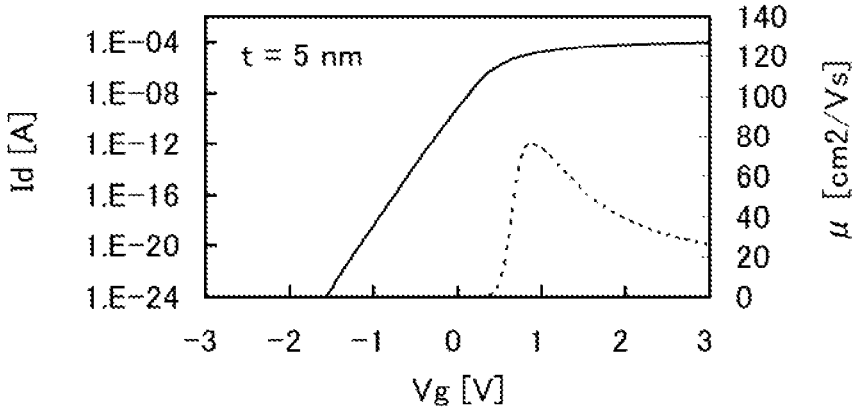

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the mobility ($\mu$, a dotted line) of the transistor having the structure illustrated in FIG. 20A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 17A shows the gate voltage dependence of the transistor in the case where the thickness of the gate insulating layer is 15 nm, FIG. 17B shows that of the transistor in the case where the thickness of the gate insulating layer is 10 nm, and FIG. 17C shows that of the transistor in the case where the thickness of the gate insulating layer is 5 nm. As the gate insulating layer is thinner, the drain current $I_d$ in an off state (off-state current) in particular is significantly decreased. In contrast, there is no noticeable change in the peak value of the mobility $\mu$ and the drain current $I_d$ in an on state (on-state current). The graphs show that the drain current exceeds 1.0 µA at a gate voltage of around 1 V.

Figure 18A:
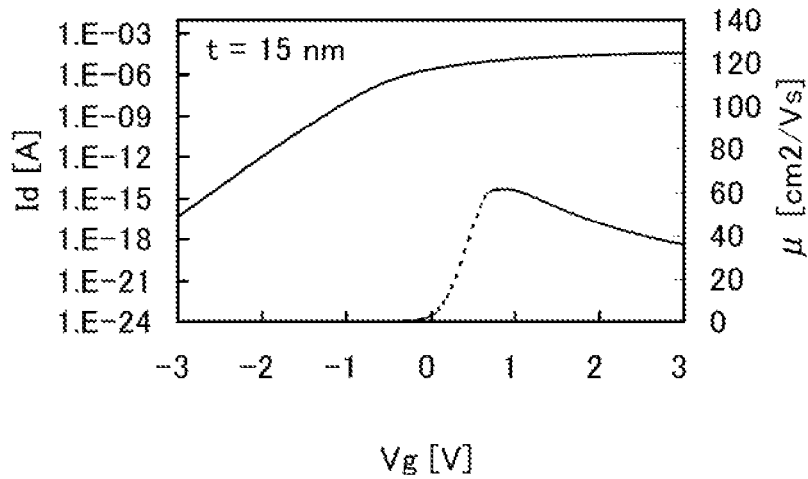
FIGS. 18A to 18C show the gate voltage dependence of drain current and mobility obtained by calculation.
Figure 18B:
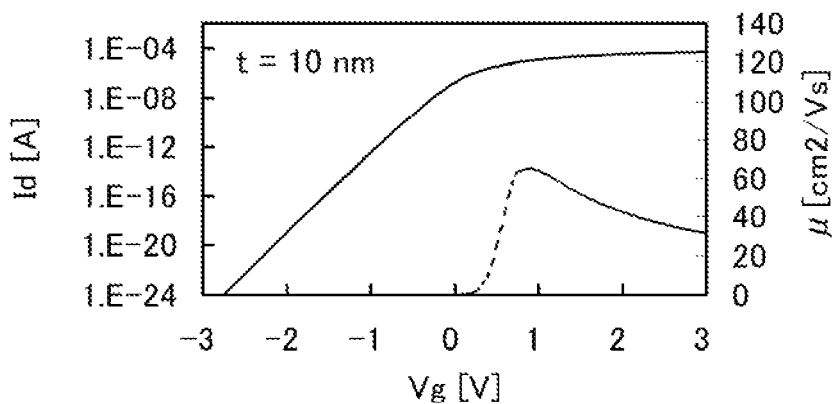
Figure 18C:
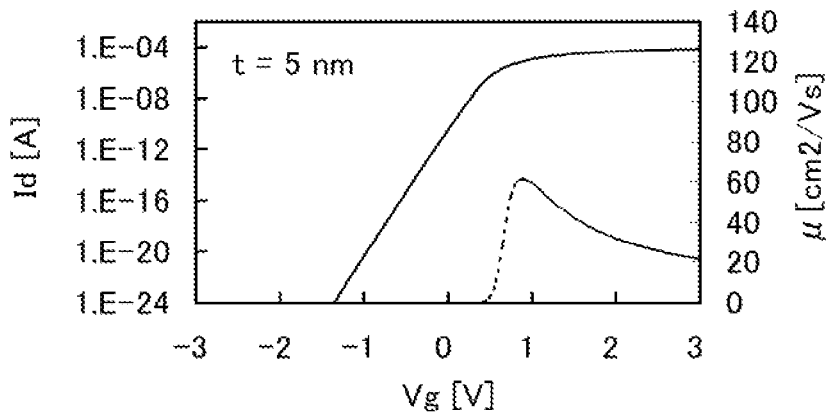

FIGS. 18A to 18C show the Elate voltage $V_g$ dependence of the drain current $I_d$ (a solid line) and the mobility $\mu$ (a dotted line) of the transistor having the structure in FIG. 20B and an offset length $L_{off}$ of 5 nm. The drain current $I_d$ is obtained by calculation under the assumption that the drain voltage is +1 V and the mobility $\mu$ is obtained by calculation under the assumption that the drain voltage is +0.1 V. FIG. 18A shows the gate voltage dependence of the transistor in the case where the thickness of the gate insulating layer is 15 nm, FIG. 18B shows that of the transistor in the case where the thickness of the gate insulating layer is 10 nm, and FIG. 18C shows that of the transistor in the case where the thickness of the gate insulating layer is 5 nm.

Figure 19A:
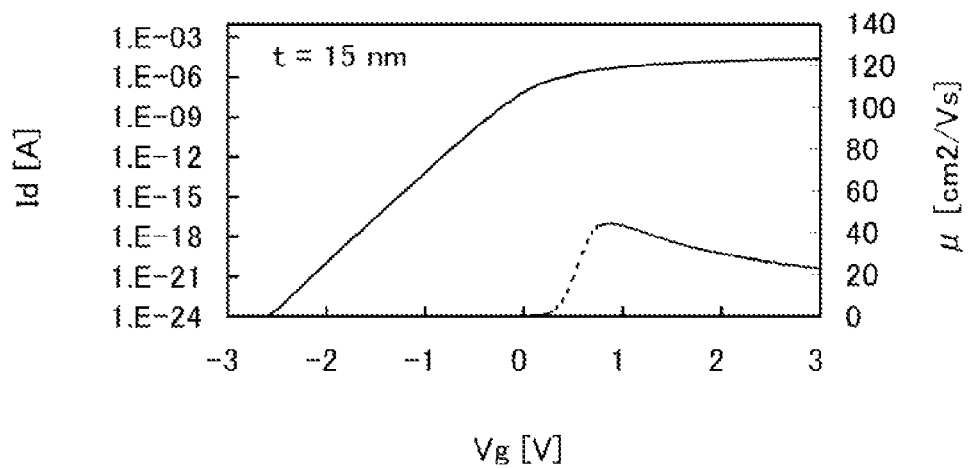
FIGS. 19A to 19C show the gate voltage dependence of drain current and mobility obtained by calculation.
Figure 19B:
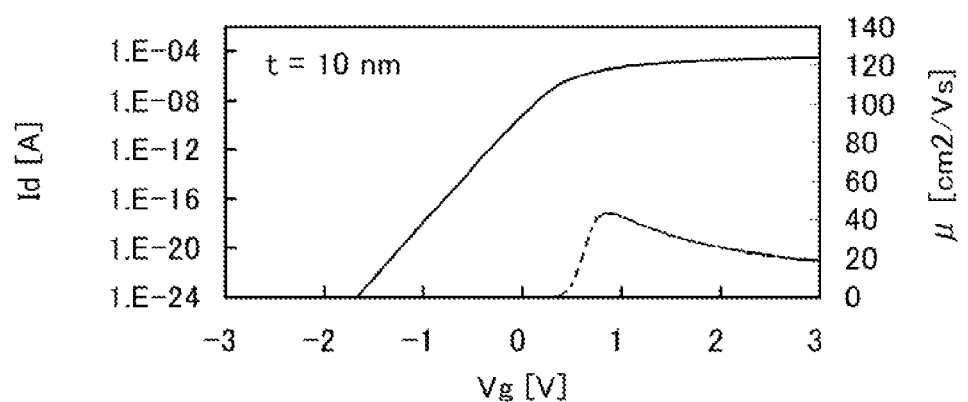
Figure 19C:
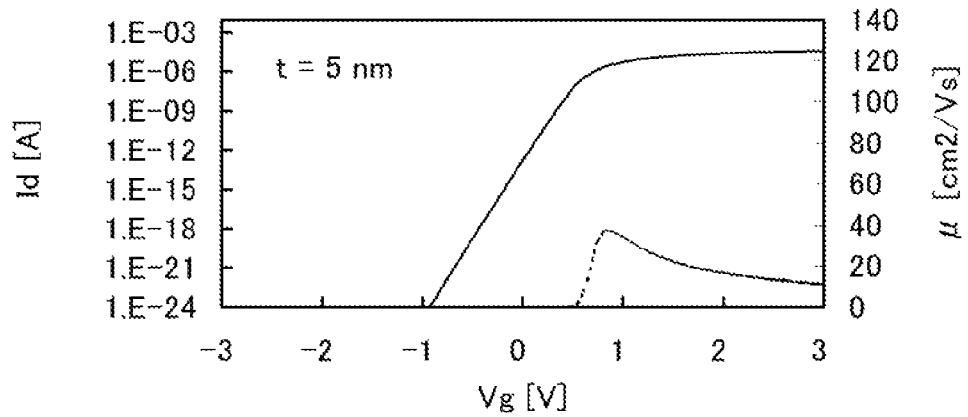
Figure 20A:
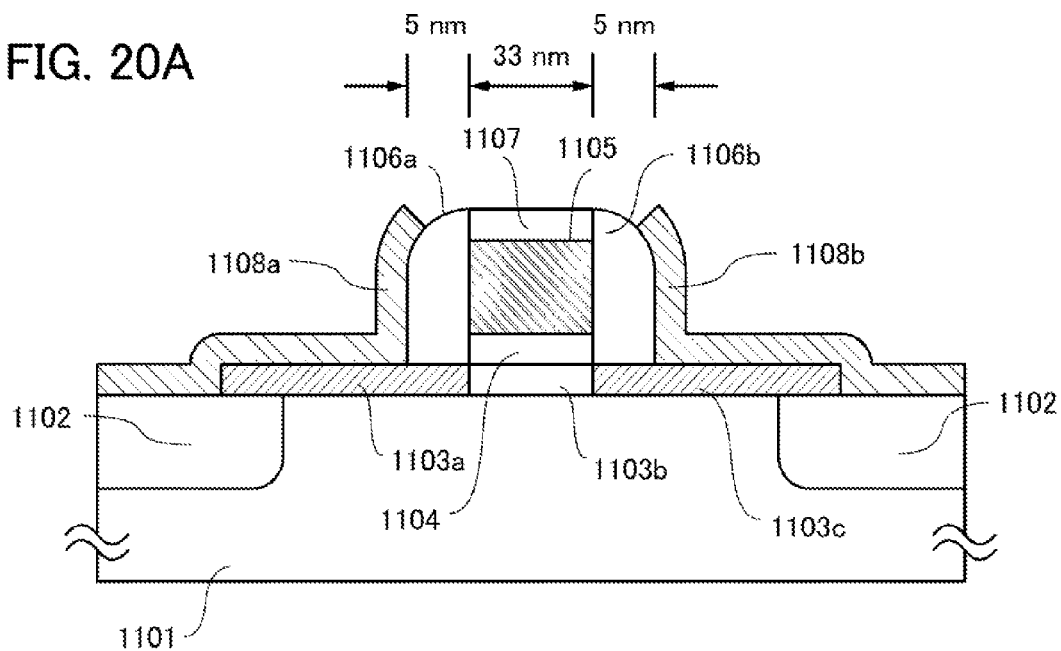
FIGS. 20A and 20B illustrate cross-sectional structures of transistors which are used in calculation.
Figure 20B:
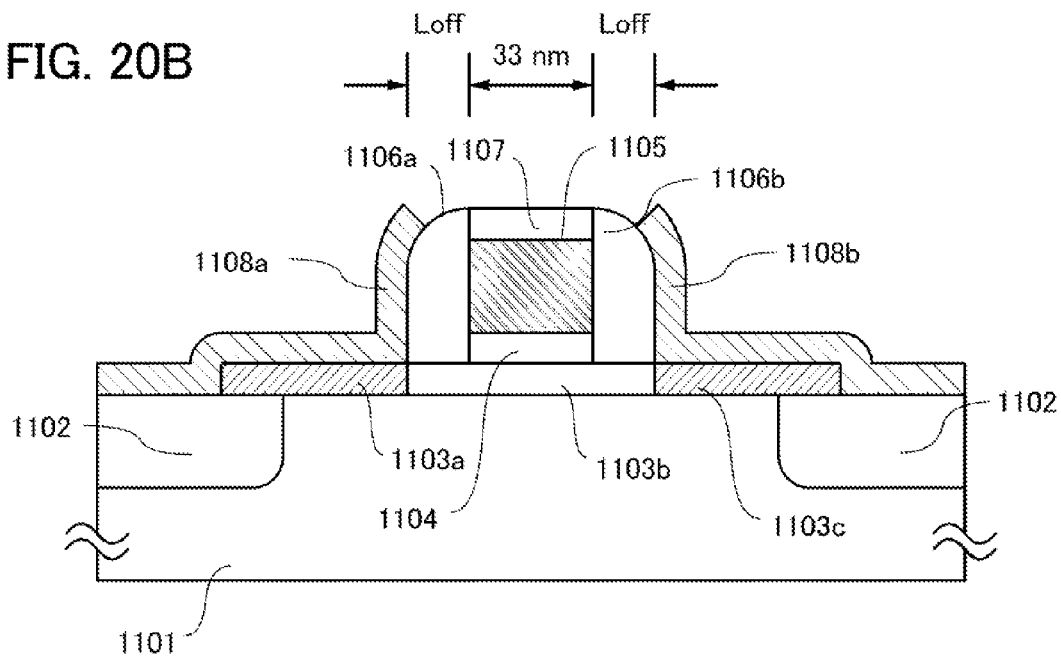

FIGS. 19A to 19C show the gate voltage dependence of the drain current $I_d$ (a solid line) and the mobility $\mu$ (a dotted line) of the transistor having the structure in FIG. 20B and an offset length $L_{off}$ of 15 nm. The drain current $I_d$ is obtained by calculation under the assumption that the drain voltage is +1 V and the mobility $\mu$ is obtained by calculation under the assumption that the drain voltage is +0.1 V. FIG. 19A shows the gate voltage dependence of the transistor in the case where the thickness of the gate insulating layer is 15 nm, FIG. 19B shows that of the transistor in the case where the thickness of the gate insulating layer is 10 nm, and FIG. 19C shows that of the transistor in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 17A to 17C, approximately 60 cm$^2$/Vs in FIGS. 18A to 18C, and approximately 40 cm$^2$/Vs in FIGS. 19A to 19C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA at a gate voltage of around 1 V.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 21A:
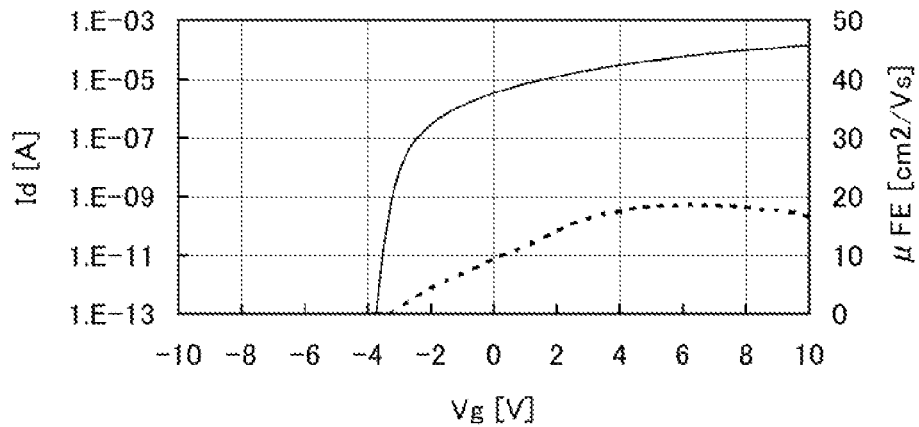
FIGS. 21A to 21C each show characteristics of a transistor including an oxide semiconductor film.
Figure 21B:
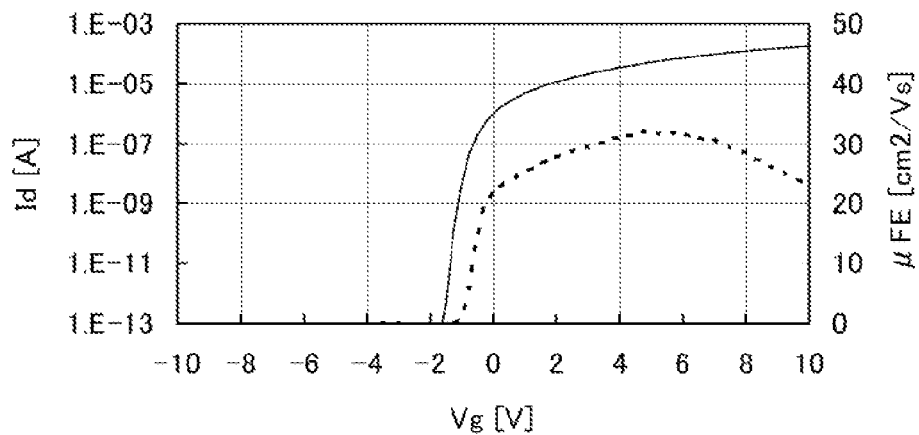
Figure 21C:
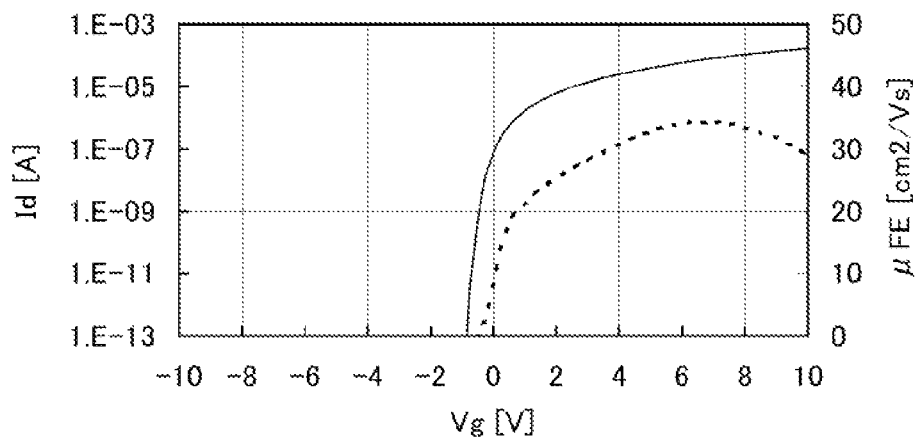

As an example, FIGS. 21A to 21C each show characteristics of a transistor that includes an oxide semiconductor film including In, Sn, and Zn as main components and having a channel length L of 3 µm and a channel width W of 10 µm, and a gate insulating layer with a thickness of 100 nm. Note that $V_d$ was set to 10 V.

FIG. 21A shows characteristics of a transistor whose oxide semiconductor film including In, Sn, and Zn as main components was formed by sputtering without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 2113 shows characteristics of a transistor whose oxide semiconductor film including in, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 21C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally oft this tendency can be confirmed by comparison between FIGS. 21A and 21B.

Note that the threshold voltage can also be controlled by changing the ratio of In, Sn, and Zn: when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drill of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, -20 V of $V_g$ was applied so that the intensity of an electric field applied to gate insulating layers was -2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 22A:
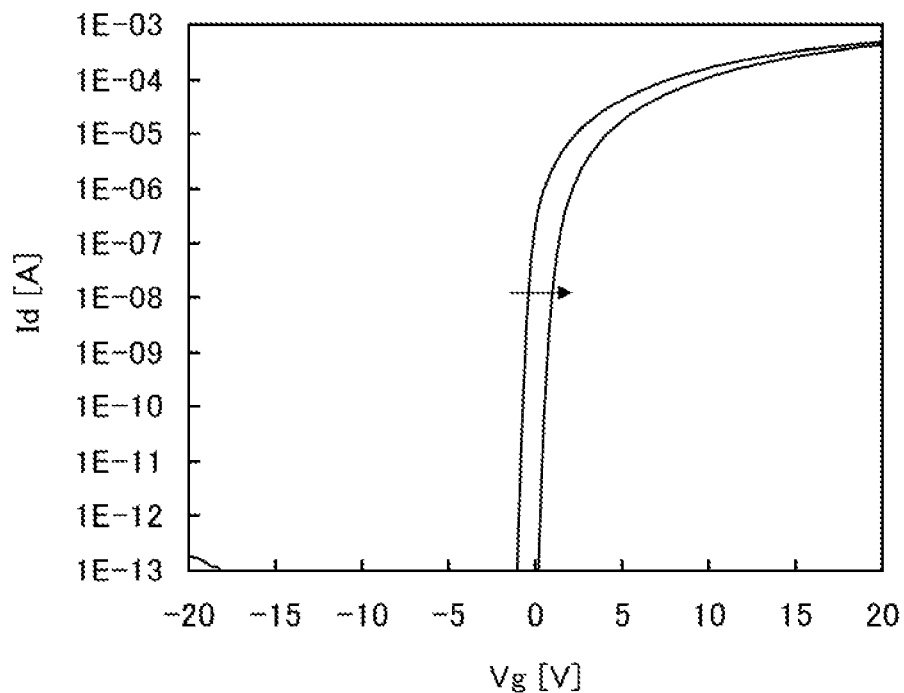
FIGS. 22A and 22B show $V_g$-$I_d$ characteristics after a BT test of a transistor of Sample 1.
Figure 22B:
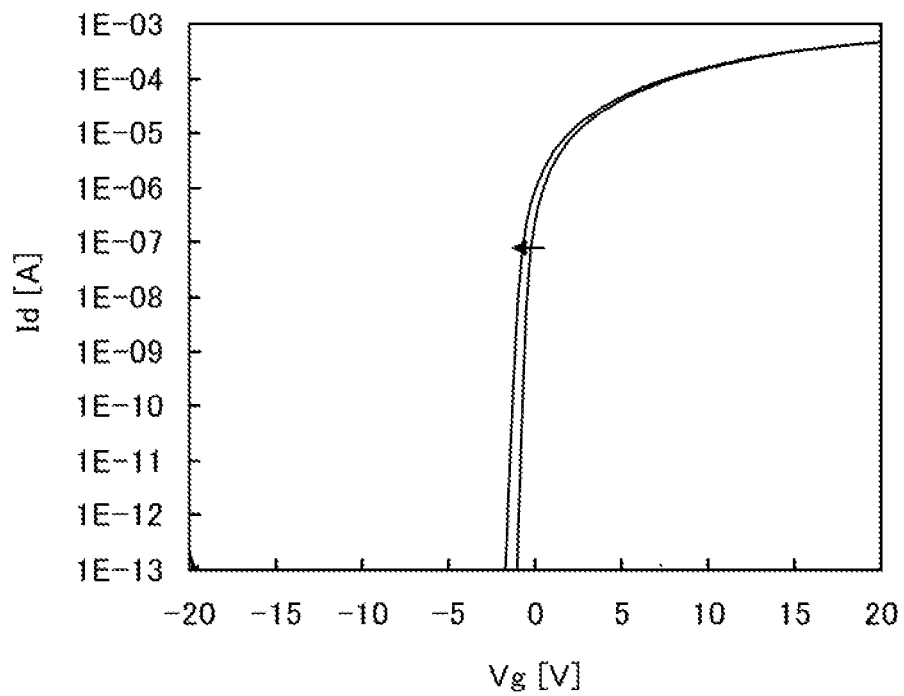
Figure 23A:
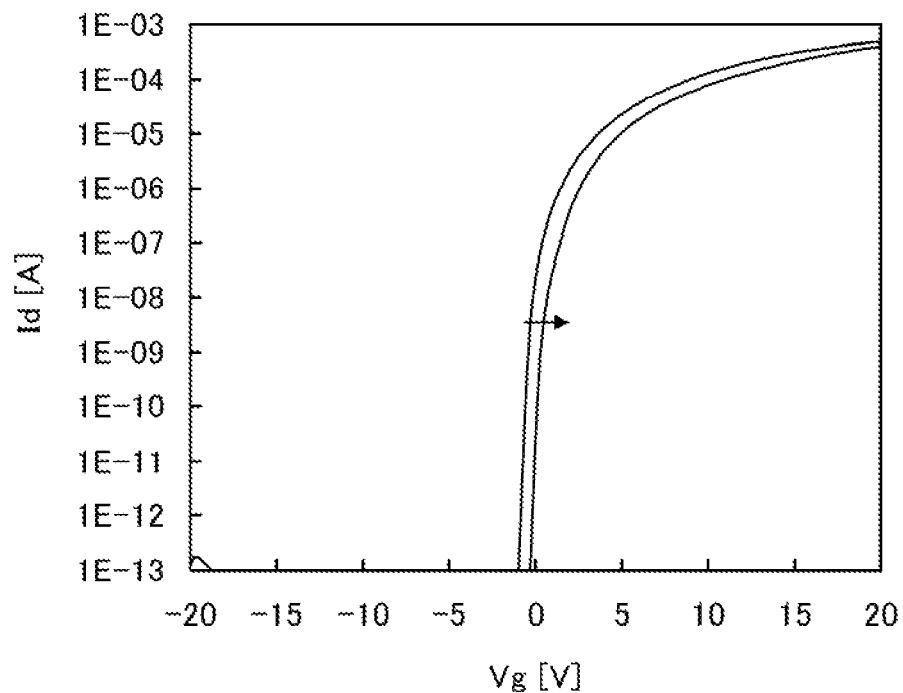
FIGS. 23A and 23B show $V_g$-$I_d$ characteristics after a BT test of a transistor of Sample 2.
Figure 23B:
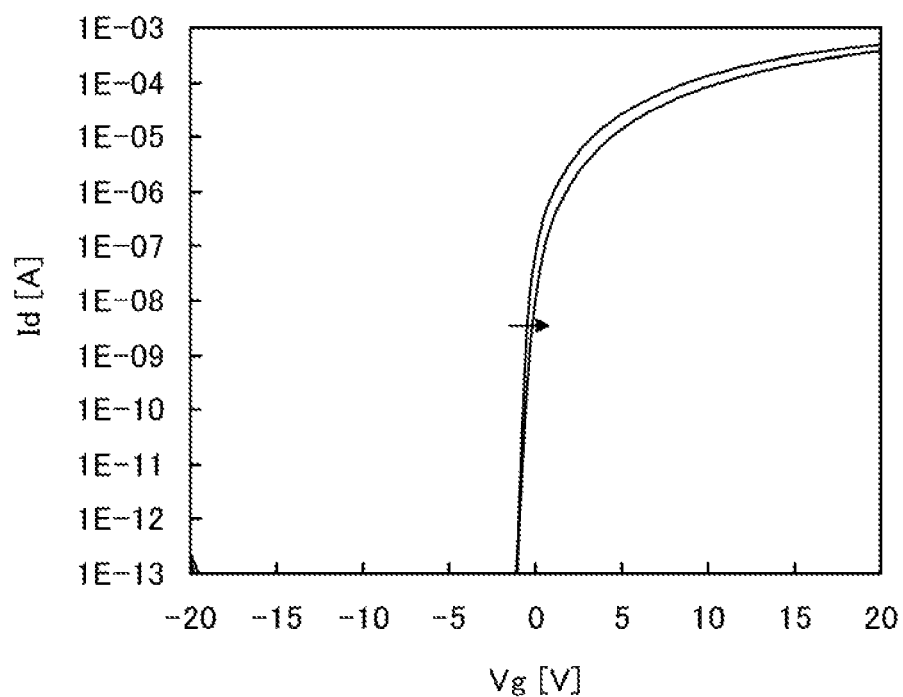

FIGS. 22A and 22B show results of the positive BT test and the negative BT test, respectively, of Sample 1. FIGS. 23A and 23B show results of the positive BT test and the negative BT test, respectively, of Sample 2.

The amount of shift in the threshold voltage of Sample 1 due to the positive BT test and that due to the negative BT test were 1.80 V and -0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated: for with excess oxygen. The excess oxygen is mainly oxygen existing between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target of In:Sn:Zn=[atomic ratio] was used as a target. Note that the substrate heating temperature in film formation was set at 200° C. A sample manufactured, in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 26:
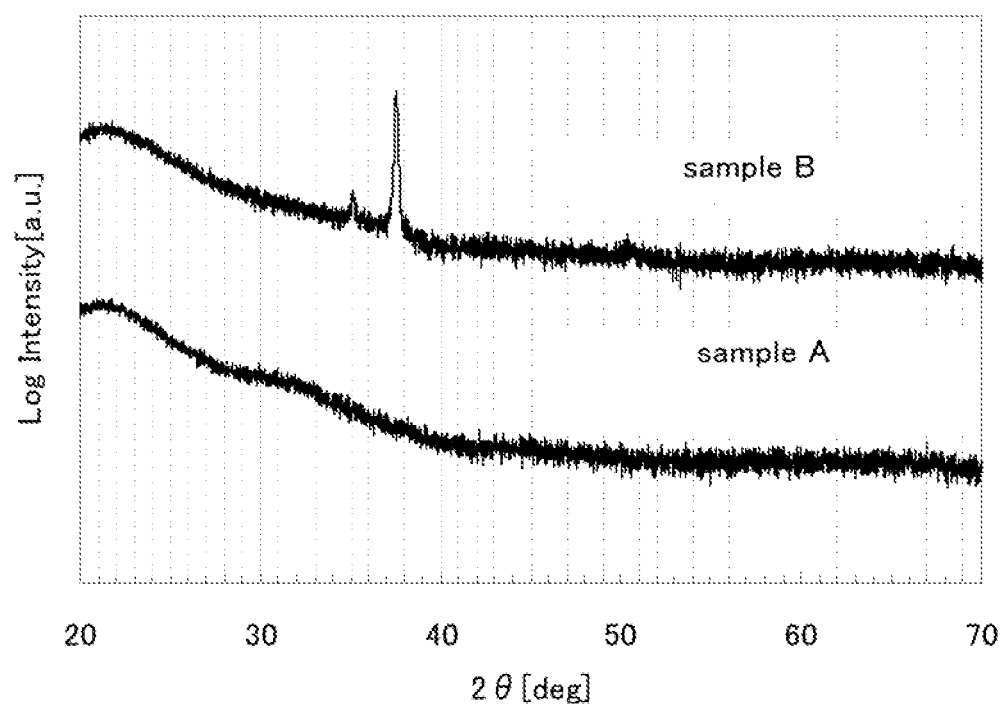
FIG. 26 shows XRD spectra of Sample A and Sample B.

FIG. 26 shows XRD spectra of Sample A and Sample B. No peak derived from crystal was observed in Sample A, whereas peaks derived from crystal were observed when 20 was around 35 deg. and 37 deg. to 38 deg. in Sample B.

As described above, by intentionally heating a substrate during deposition of an oxide semiconductor including In, Sn, and Zn as main components and/or by performing heat treatment alter the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 27:
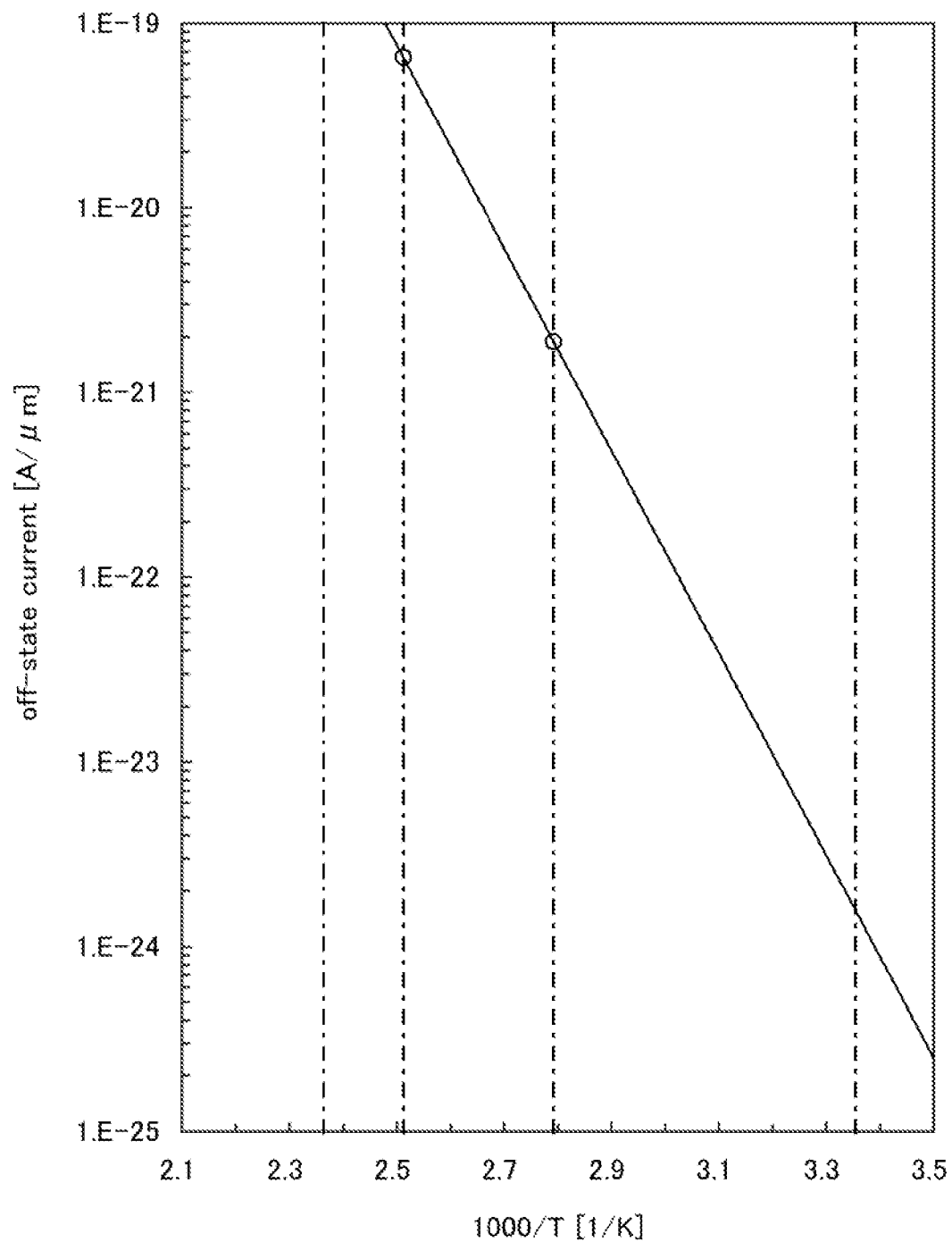
FIG. 27 shows a relation between off-state current and substrate temperature in measurement of a transistor.

Specifically, as shown in FIG. 27, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm×$10^{-19}$ A/μm) or lower, 10 zA/mm ($1\times10^{-20}$ A/mm) or lower, and 0.1 zA/μm ($1\times10^{-22}$ A/μm) or lower at 125° C., 85° C., and room temperature, respectively.

In order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 mm, a channel width W of 10 μm, Lov of 0 μm, and ON of 0 μm. Note that $V_d$ was set to 10 V. Note that the substrate temperature was −40° C.−25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 24:
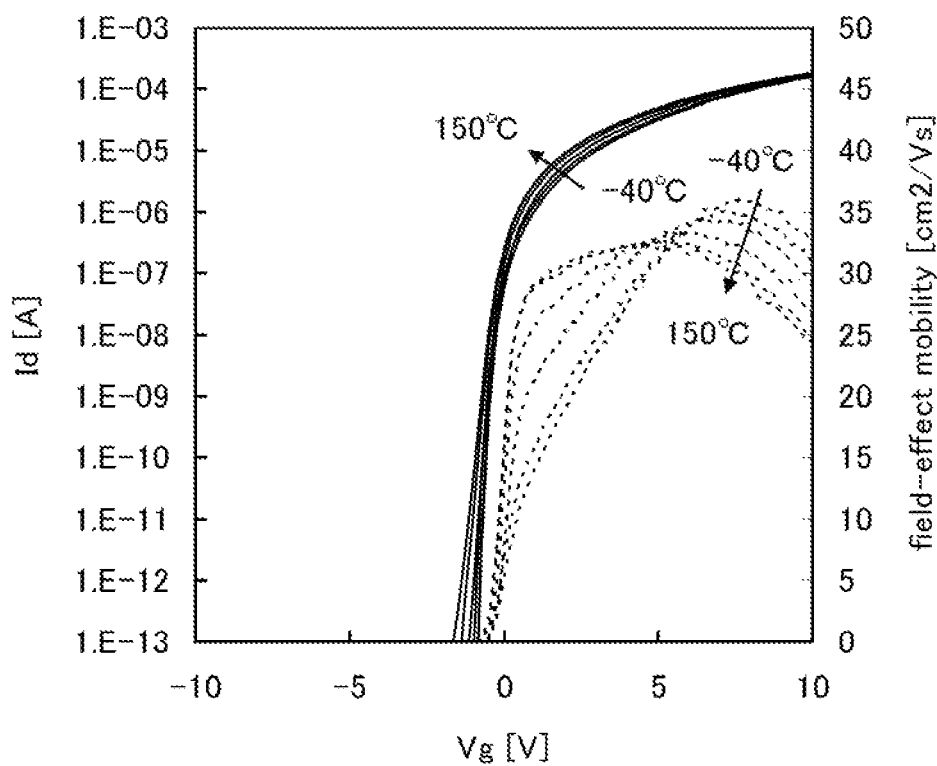
FIG. 24 shows $V_g$ dependence of $I_d$ and field-effect mobility.
Figure 25A:
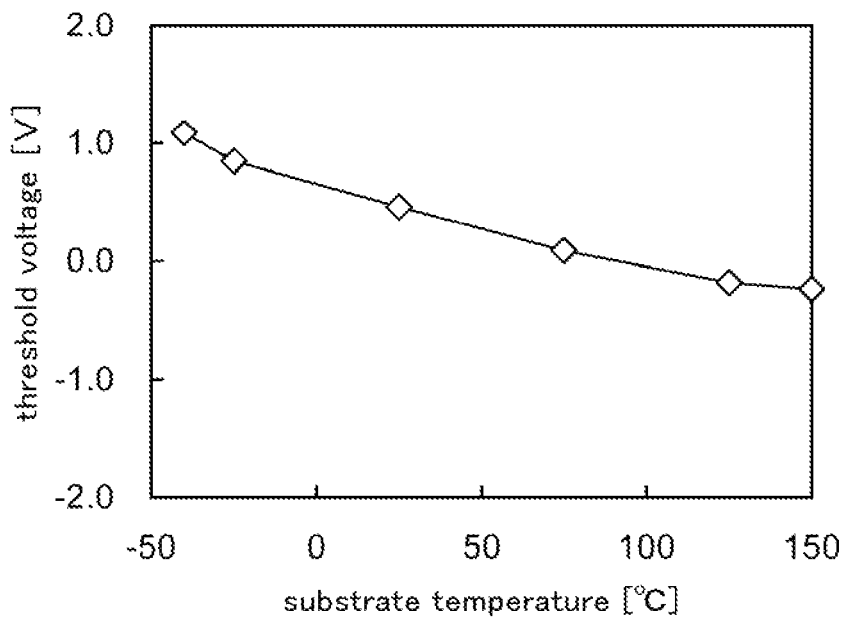
FIG. 25A shows a relation between substrate temperature and threshold voltage and FIG. 25B shows a relation between substrate temperature and field-effect mobility.

FIG. 24 shows the $V_g$ dependence of $I_d$ (a solid line) and field-effect mobility (a dotted line). FIG. 25A shows a relation between the substrate temperature and the threshold voltage, and FIG. 25B shows a relation between the substrate temperature and the field-effect mobility.

From FIG. 25A, it is found that the threshold voltage gets lower as the substrate temperature increases. Note that the threshold voltage is decreased from 1.09 V to −0.23 V in the range from −40° C. to 150° C.

Figure 25B:
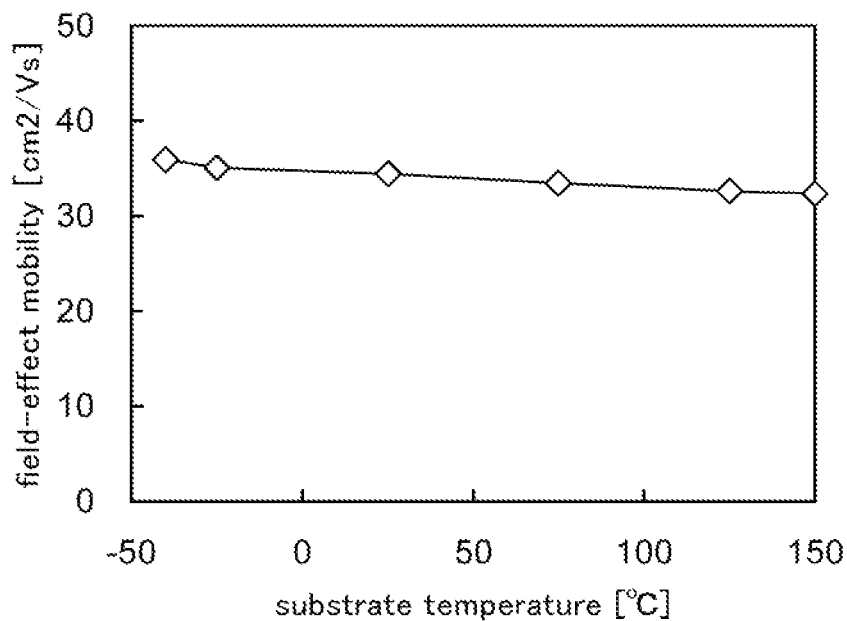

From FIG. 25B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Embodiment 6

In this embodiment, examples of a transistor in which an In—Sn—Zn—O film is used as an oxide semiconductor film will be described with reference to FIGS. 28A and 28B and FIGS. 29A and 29B.

Figure 28A:
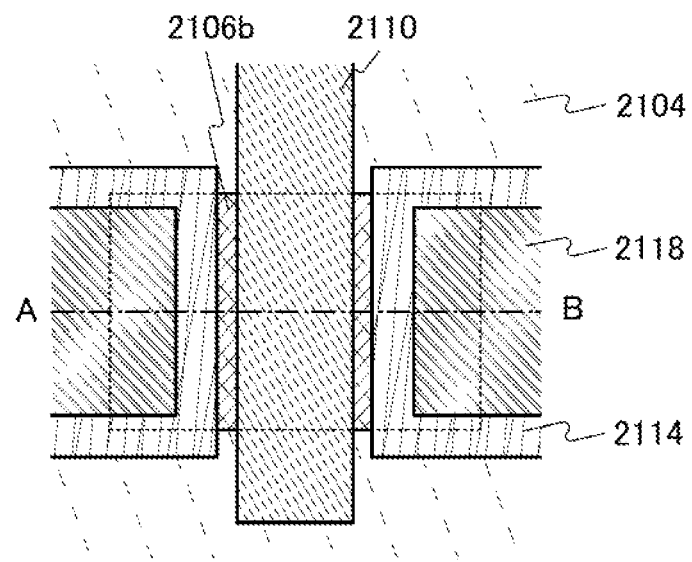
FIGS. 28A and 28B illustrate a structure of a transistor.
Figure 28B:
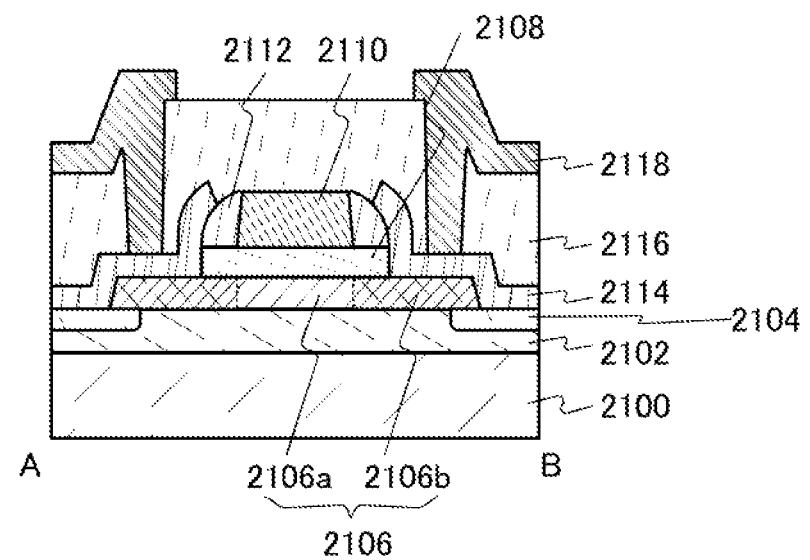

FIGS. 28A and 28B are a top view and a cross-sectional view of a coplanar transistor having a top-gate top-contact structure. FIG. 28A is the top view of the transistor. FIG. 28B illustrates cross section A-B along dashed-dotted line A-B in FIG. 28A.

The transistor illustrated in FIG. 28B includes a substrate 2100; a base insulating film 2102 provided over the substrate 2100; a protective insulating film 2104 provided in the periphery of the base insulating film 2102; an oxide semiconductor film 2106 provided over the base insulating film 2102 and the protective insulating film 2104 and including a high-resistance region 2106a and low-resistance regions 2106b; a gate insulating layer 2108 provided over the oxide semiconductor film 2106; a gate electrode 2110 provided to overlap with the oxide semiconductor film 2106 with the gate insulating layer 2108 interposed therebetween; a sidewall insulating film 2112 provided in contact with a side surface of the gate electrode 2110; a pair of electrodes 2114 provided in contact with at least the low-resistance regions 2106b; an interlayer insulating film 2116 provided to cover at least the oxide semiconductor film 2106, the gate electrode 2110, and the pair of electrodes 2114; and a wiring 2118 provided to be connected to at least one of the pair of electrodes 2114 through an opening formed in the interlayer insulating film 2116.

Although not illustrated, a protective film may be provided to cover the interlayer insulating film 2116 and the wiring 2118. With the protective film, a minute amount of leakage current generated by surface conduction of the interlayer insulating film 2116 can be reduced and thus the off-state current of the transistor can be reduced.

Another example of a transistor in which an In—Sn—Zn—O film is used as an oxide semiconductor film will be described below.

Figure 29A:
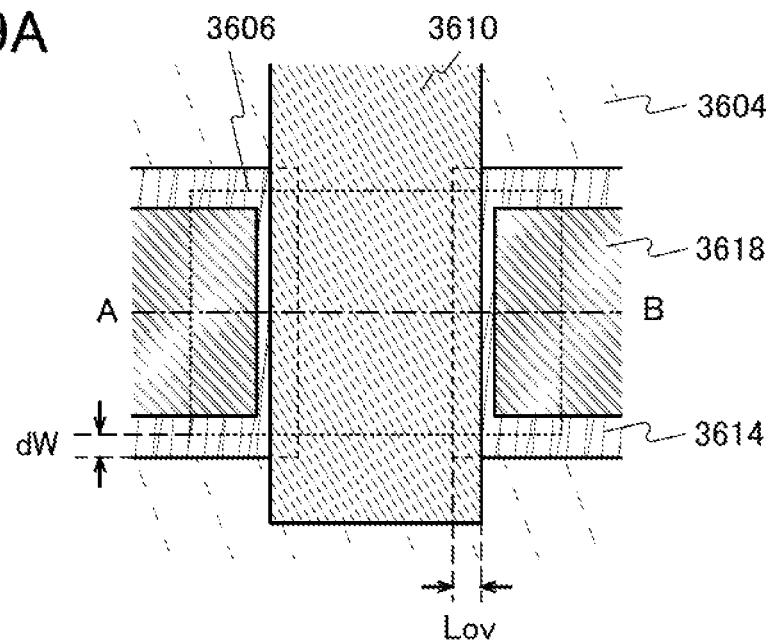
FIGS. 29A and 29B illustrate a structure of a transistor.
Figure 29B:
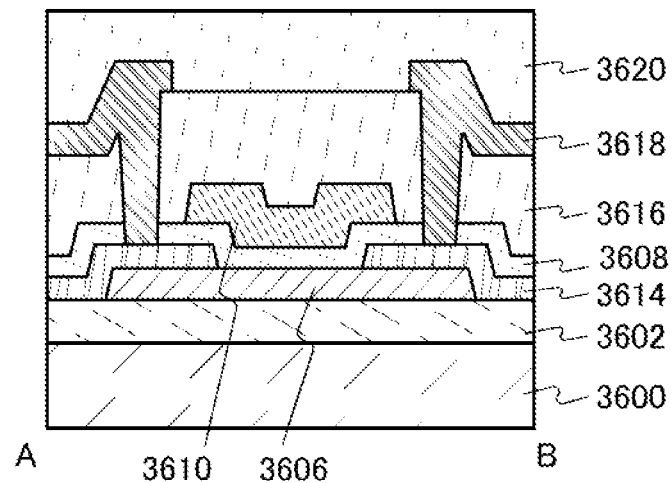

FIGS. 29A and 29B are a top view and a cross-sectional view illustrating a structure of a transistor manufactured in this embodiment. FIG. 29A is the top view of the transistor. FIG. 29B is a cross-sectional view along dashed-dotted line A-B in FIG. 29A.

The transistor illustrated in FIG. 29B includes a substrate 3600; a base insulating film 3602 provided over the substrate 3600; an oxide semiconductor film 3606 provided over the base insulating film 3602; a pair of electrodes 3614 in contact with the oxide semiconductor film 3606; a gate insulating layer 3608 provided over the oxide semiconductor film 3606 and the pair of electrodes 3614; a gate electrode 3610 provided to overlap with the oxide semiconductor film 3606 with the gate insulating layer 3608 interposed therebetween; an interlayer insulating film 3616 provided to cover the gate insulating layer 3608 and the gate electrode 3610; wirings 3618 connected to the pair of electrodes 3614 through openings formed in the interlayer insulating film 3616; and a protective film 3620 provided to cover the interlayer insulating film 3616 and the wirings 3618.

As the substrate 3600, a glass substrate can be used. As the base insulating film 3602, a silicon oxide film can be used. As the oxide semiconductor film 3606, an In—Sn—Zn—O film can be used. As the pair of electrodes 3614, a tungsten film can be used. As the gate insulating layer 3608, a silicon oxide film can be used. The gate electrode 3610 can have a stacked structure of a tantalum nitride film and a tungsten film. The interlayer insulating film 3616 can have a stacked structure of a silicon oxynitride film and a polyimide film. The wirings 3618 can each have a stacked structure in which a titanium film, an aluminum film, and a titanium film are formed in this order. As the protective film 3620, a polyimide film can be used.

Note that in the transistor having the structure illustrated in FIG. 29A, the width of a portion where the gate electrode 3610 overlaps with one of the pair of electrodes 3614 is referred to as Lov. Similarly, the width of a portion of the pair of electrodes 3614, which does not overlap with the oxide semiconductor film 3606, is referred to as dW.

Embodiment 7

In this embodiment, described are examples of an electronic appliance each provided with the input/output device which is one of the semiconductor devices of the above embodiments.

Structural examples of the electronic appliances of this embodiment will be described with reference to FIGS. 12A to 12D. FIGS. 12A to 12D are schematic views each illustrating a structural example of the electronic appliance of this embodiment.

Figure 12A:
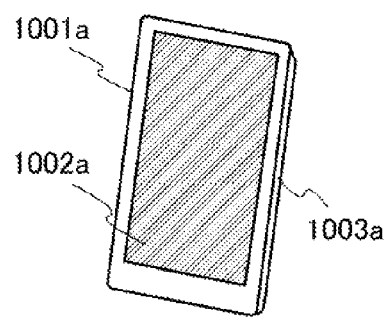
FIGS. 12A to 12D are schematic views each illustrating an example of an electronic appliance.

An electronic appliance in FIG. 12A is an example of a portable information terminal. The portable information terminal in FIG. 12A includes a housing 1001a and an input/output unit 1002a provided in the housing 1001a.

Note that a side surface 1003a of the housing 1001a may be provided with a connection terminal for connecting the portable information terminal to an external device and one or More buttons for operating the portable information terminal in FIG. 12A.

The portable information terminal in FIG. 12A includes a CPU, a main memory, an interface transmitting/receiving a signal traveling between the external device and each of the CPU and the main memory, and an antenna transmitting/receiving a signal to/from the external device, in the housing 1001a. Note that in the housing 1001a, one or plural integrated circuits having a specific function may be provided.

The portable information terminal illustrated in FIG. 12A has a function of one or more of a telephone set, an electronic book, a personal computer, and a game machine.

Figure 12C:
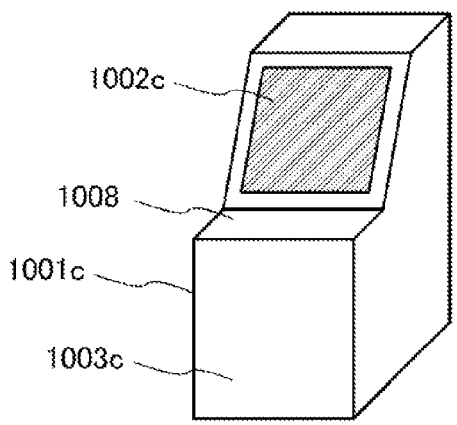
Figure 12B:
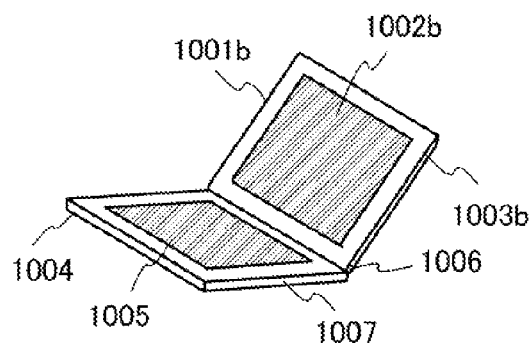

An electronic appliance in FIG. 12B is an example of a foldable portable information terminal. The portable information terminal in FIG. 12B includes a housing 1001b, an input/output unit 1002b provided in the housing 1001b, a housing 1004, an input/output unit 1005 provided in the housing 1004, and a hinge 1006 for connecting the housing 1001b and the housing 1004.

In the portable information terminal in FIG. 12B, the housing 1001b can be stacked on the housing 1004 by moving the housing 1091b or the housing 1004 with the hinge 1006.

Note that a side surface 1003b of the housing 1001b or a side surface 1007 of the housing 1004 may be provided with a connection terminal lot connecting the portable information terminal to an external device and one or more buttons for Operating the portable information terminal illustrated in FIG. 12B.

The input/output unit 1002b and the input/output unit 1005 may display different images or one image. Note that the input/output unit 1005 is not necessarily provided; a keyboard which is an input device may be provided instead of the input/output unit 1005.

The portable information terminal in FIG. 12B includes a CPU, a main memory, and an interface transmitting/receiving a signal traveling between the external device and each of the CPU and the main memory, in the housing 1001b or the housing 1004. Note that in the housing 1001b or the housing 1004, one or plural integrated circuits having a specific function may be provided. In addition, the portable information terminal in FIG. 12B may include an antenna transmitting/receiving a signal to/from the external device.

The portable information terminal illustrated in FIG. 12B has a function of one or more of a telephone set, an electronic book, a personal computer, and a game machine.

An electronic appliance illustrated in FIG. 12C is an example of a stationary information terminal. The stationary information terminal in FIG. 12C includes a housing 1001c and an input/output unit 1002c provided in the housing 1001c.

Note that the input/output unit 1002c can be provided in a top board 1005 of the housing 1001c.

The stationary information terminal in FIG. 12C includes a CPU, a main memory, and an interface transmitting/receiving a signal traveling between the external device and each of the CPU and the main memory, in the housing 1001c. Note that in the housing 1001c, one or plural integrated circuits having a specific function may be provided. In addition, the stationary information terminal in FIG. 12C may include an antenna transmitting receiving a signal to/from the eternal device.

Further, a side surface 1003e of the housing 1001c in the stationary information terminal in FIG. 12C may be provided with one or more of a ticket ejection portion that ejects a ticket or the like, a coin slot, and a bill slot.

The stationary information terminal in FIG. 12C serves, for example, as an automated teller machine, an information communication terminal for ticketing or the like (also referred to as a multi-media station), or a game machine.

Figure 12D:
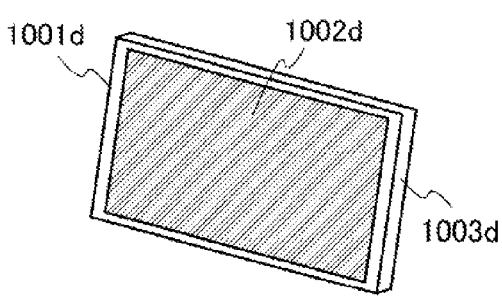

FIG. 12D shows an example of a stationary information terminal. The stationary information terminal in FIG. 12D includes a housing 1001d and an input/output unit 1002d provided in the housing 1001d. Note that a support for supporting the housing 1001d may also be provided.

Note that a side surface 1003d of the housing 1001d may be provided with a connection terminal for connecting the stationary information terminal to an external device and one or more buttons for operating the stationary information terminal in FIG. 12D.

The stationary information terminal in FIG. 12D may include a CPU, a main memory, and an interface transmitting/receiving a signal traveling between the external device and each of the CPU and the main memory, in the housing 1001d. Further, in the housing 1001d, one or plural integrated circuits having a specific function may be provided. In addition, the stationary information terminal in FIG. 12D may include an antenna transmitting/receiving a signal to/from the external device.

The stationary information terminal in FIG. 12D serves, for example, as a digital photo frame, an input/output monitor, or a television device.

The input/output device which is one of the semiconductor devices of Embodiment 4 is used as an input/output unit of an electronic appliance, and for example, is used as each of the input/output units 1002a to 1002d in FIGS. 12A to 12D. In addition, the input/output device which is one of the semiconductor devices of Embodiment 4 may be used as the input/output unit 1005 in FIG. 12B.

As described with reference to FIGS. 12A to 12D, the examples of the electronic appliance of this embodiment each include an input/output unit for which the input/output device which is one of the semiconductor devices of Embodiment 4 is used. Consequently, it is possible to operate the electronic appliance or input data to the electronic appliance with a finger or a pen.

In addition, the housings of the examples of electronic appliances of this embodiment may be each provided with one or more of a photoelectric conversion portion which generates power supply voltage in accordance with the illuminance of incident light and an operating portion for operating the input/output device. For example, when the photoelectric conversion portion is provided, an external power supply is not needed; thus, the electronic appliance can be used for a long time even in an environment where an external power supply is not provided.

This application is based on Japanese Patent Application serial no. 2010-274697 filed with Japan Patent Office on Dec. 9, 2010 and Japanese Patent Application serial no. 2011-108272 filed with Japan Patent Office on May 13, 2011, the entire contents of which are hereby incorporated by reference.

What is claimed is:

1. A photodetector circuit comprising:
   a photoelectric conversion element;
   a first conductive layer;
   a first insulating layer over the first conductive layer;
   a first semiconductor layer overlapping with a first portion of the first conductive layer with the first insulating layer interposed therebetween;
   a second semiconductor layer overlapping with a second portion of the first conductive layer with the first insulating layer interposed therebetween;
   a second conductive layer electrically connected to a first portion of the first semiconductor layer, a first portion of the second semiconductor layer, and the photoelectric conversion element; and
   a third conductive layer electrically connected to a second portion of the first semiconductor layer and a second portion of the second semiconductor layer and overlapping with the first portion of the first conductive layer and the second portion of the first conductive layer,
   wherein the second portion of the first semiconductor layer is located between the first portion of the first semiconductor layer and the second portion of the second semiconductor layer, and
   wherein the second portion of the second semiconductor layer is located between the first portion of the second semiconductor layer and the second portion of the first semiconductor layer.

2. A photodetector circuit according to claim 1, further comprising:
   a fourth conductive layer;
   a fifth conductive layer;
   a second insulating layer over the second conductive layer, the third conductive layer, the fourth conductive layer, and the fifth conductive layer; and
   a sixth conductive layer overlapping with the fourth conductive layer with the second insulating layer therebetween,
   wherein the sixth conductive layer is electrically connected to the second conductive layer and the fifth conductive layer.

3. A photodetector circuit according to claim 2, wherein the first conductive layer is electrically connected to the fourth conductive layer.

4. A photodetector circuit according to claim 3, wherein each of the second conductive layer, the third conductive layer, the fourth conductive layer, and the fifth conductive layer comprise the same metal material.

5. A photodetector circuit according to claim 4, wherein each of the first semiconductor layer and the second semiconductor layer comprises an oxide semiconductor.

6. A photodetector circuit according to claim 4, wherein the photoelectric conversion element comprises a third semiconductor layer over the fifth conductive layer, and
   wherein the sixth conductive layer is electrically connected to the third semiconductor layer.

7. A photodetector circuit according to claim 6, wherein the third semiconductor layer comprises an amorphous silicon.

8. An input/output device comprising:
   a substrate;
   a photodetector circuit over the substrate; and
   a display circuit over the substrate,
   wherein the photodetector circuit comprises:
      a photoelectric conversion element;
      a first conductive layer over the substrate;
      a first insulating layer over the first conductive layer;
      a first semiconductor layer overlapping with a first portion of the first conductive layer with the first insulating layer interposed therebetween;
      a second semiconductor layer overlapping with a second portion of the first conductive layer with the first insulating layer interposed therebetween;
      a second conductive layer electrically connected to a first portion of the first semiconductor layer, a first portion of the second semiconductor layer, and the photoelectric conversion element; and
      a third conductive layer electrically connected to a second portion of the first semiconductor layer and a second portion of the second semiconductor layer and overlapping with the first portion of the first conductive layer and the second portion of the first conductive layer,
   wherein the display circuit comprises:
      a seventh conductive layer over the substrate;
      the first insulating layer over the seventh conductive layer; and
      a fourth semiconductor layer overlapping with the seventh conductive layer with the first insulating layer interposed therebetween,
   wherein the second portion of the first semiconductor layer is located between the first portion of the first semiconductor layer and the second portion of the second semiconductor layer, and
   wherein the second portion of the second semiconductor layer is located between the first portion of the second semiconductor layer and the second portion of the first semiconductor layer.

9. An input/output device according to claim 8, further comprising:
   a fourth conductive layer;
   a fifth conductive layer;

a second insulating layer over the second conductive layer, the third conductive layer, the fourth conductive layer, and the fifth conductive layer; and a sixth conductive layer overlapping with the fourth conductive layer with the second insulating layer therebetween, wherein the sixth conductive layer is electrically connected to the second conductive layer and the fifth conductive layer.

10. An input/output device according to claim 9, wherein the first conductive layer is electrically connected to the fourth conductive layer.

11. An input/output device according to claim 10, wherein each of the second conductive layer, the third conductive layer, the fourth conductive layer, and the fifth conductive layer comprise the same metal material.

12. An input/output device according to claim 11, wherein each of the first semiconductor layer, the second semiconductor layer, and the fourth semiconductor layer comprises an oxide semiconductor.

13. An input/output device according to claim 11, wherein the photoelectric conversion element comprises a third semiconductor layer over the fifth conductive layer, and wherein the sixth conductive layer is electrically connected to the third semiconductor layer.

14. An input/output device according to claim 13, wherein the third semiconductor layer comprises an amorphous silicon.

15. A photodetector circuit comprising:
a photoelectric conversion element;
a first transistor;
a second transistor; and
a third transistor, wherein a first terminal of the first transistor is electrically connected to a first terminal of the photoelectric conversion element, wherein a first terminal of the second transistor is electrically connected to the first terminal of the photoelectric conversion element, wherein a second terminal of the first transistor is electrically connected to a gate of the third transistor, wherein a second terminal of the second transistor is electrically connected to the gate of the third transistor, and wherein a gate of the first transistor is electrically connected to a gate of second transistor.

16. A photodetector circuit according to claim 15, wherein each of the first transistor and the second transistor comprises an oxide semiconductor.

17. A photodetector circuit according to claim 15, wherein each of the first transistor and the second transistor comprises an oxide semiconductor, and wherein the photoelectric conversion element comprises an amorphous silicon.

18. A photodetector circuit according to claim 15, further comprising a fourth transistor, wherein a first terminal of the third transistor is electrically connected to a first terminal of the fourth transistor.

19. A photodetector circuit according to claim 18, wherein each of the first transistor, the second transistor, the third transistor, and the fourth transistor comprises an oxide semiconductor.

20. A photodetector circuit according to claim 18, wherein each of the first transistor, the second transistor, the third transistor, and the fourth transistor comprises an oxide semiconductor, and wherein the photoelectric conversion element comprises an amorphous silicon.

* * * * *

UNITED STATES PATENT AND TRADEMARK OFFICE
CERTIFICATE OF CORRECTION

| | | |
|---|---|---|
| PATENT NO. | : 8,461,590 B2 | Page 1 of 3 |
| APPLICATION NO. | : 13/313539 | |
| DATED | : June 11, 2013 | |
| INVENTOR(S) | : Hikaru Tamura et al. | |

It is certified that error appears in the above-identified patent and that said Letters Patent is hereby corrected as shown below:

In the Specification:

Column 2, line 61, "first field-effect transistor" should read "the first field-effect transistor"

Column 7, lines 48-49, "this, structure may be" should read "this, a structure may be"

Column 7, lines 50-51, "conductive layer 124e" should read "conductive layer 124c"

Column 9, line 7, "europium (EA gadolinium" should read "europium (Eu), gadolinium"

Column 9, line 22, "In-Sn-Zn-based" should read "In-Sm-Zn-based"

Column 10, line 16, "with relative case." should read "with relative ease."

Column 10, line 41, "$(x_1, y_1) (x_1, y_2)$" should read "$(x_1, y_1), (x_1, y_2)$"

Column 10, line 61, "In:Sn:Zn=2:2:3," should read "In:Sn:Zn=1:2:2,"

Column 11, lines 48-49, "an upper halt" should read "an upper half"

Column 13, line 50, "eau be expressed as" should read "can be expressed as"

Column 13, line 52, "As larger in is," should read "As larger m is,"

Column 13, line 61, "In-PrZn-based" should read "In-Pr-Zn-based"

Column 13, line 62, "In-Sn-Zn-based" should read "In-Sm-Zn-based"

Column 17, line 53, "lacing each other" should read "facing each other"

Column 18, line 24, "FIGS. 2C and 21/Note that" should read "FIGS. 2C and 2D. Note that"

Column 20, line 29, "the other or the" should read "the other of the"

Signed and Sealed this
Sixth Day of August, 2013

Teresa Stanek Rea
*Acting Director of the United States Patent and Trademark Office*

CERTIFICATE OF CORRECTION (continued)
U.S. Pat. No. 8,461,590 B2

Cont.

In the Specification:

Column 20, line 41, "timing of stalling" should read "timing of starting"

Column 20, line 57, "En that case" should read "In that case"

Column 21, line 57, "the pair of lacing" should read "the pair of facing"

Column 24, line 36, "two shill registers." should read "two shift registers"

Column 24, line 54-55, "for example, a shill register." should read "for example, a shift register."

Column 24, line 60, "plurality of shill registers." should read "plurality of shift registers."

Column 24, line 66, "data signal Output circuit 304" should read "data signal output circuit 304"

Column 29, line 28, "taken alone line" should read "taken along line"

Column 29, line 65, "agate insulating layer" should read "a gate insulating layer"

Column 31, line 53, "and 50302 instead" should read "and 503a2 instead"

Column 31, line 64, "501g to 501f," should read "501g to 501i,"

Column 32, line 1, "501g to 501f" should read "501g to 501i"

Column 32, lines 18-19, "conductive layer 501a" should read "conductive layer 501g"

Column 34, line 59, "the old state current" should read "the off-state current"

Column 36, line 58, "in a channel, $\epsilon$ represents" should read "in a channel, $\varepsilon$ represents"

Column 37, lines 22-23, "The detect density N" should read "The defect density N"

Column 39, line 23, "the Elate voltage" should read "the gate voltage"

Column 40, line 22, "FIG. 2113 shows" should read "FIG. 21B shows"

Column 40, line 23, "including in, Sn," should read "including In, Sn,"

Column 41, line 4, "normally oft this" should read "normally off this"

Column 41, line 22, "drill of the" should read "drift of the"

Column 42, lines 40-41, "In:Sn:Zn=[atomic ratio]" should read "In:Sn:Zn=1:1:1[atomic ratio]"

Column 42, line 53, "observed when 20" should read "observed when $2\theta$"

Column 42, line 58, "treatment alter the deposition" should read "treatment after the deposition"

CERTIFICATE OF CORRECTION (continued)
U.S. Pat. No. 8,461,590 B2

Cont.

In the Specification:

Column 45, line 64, "housing 1091b or" should read "housing 1001b or"

Column 45, line 67, "a connection terminal lot" should read "a connection terminal for"

Column 46, line 27, "top board 1005" should read "top board 1008"

Column 46, line 35, "transmitting receiving a" should read "transmitting/receiving a"

Column 46, line 35, "the eternal device." should read "the external device."

Column 46, line 36, "a side surface 1003e" should read "a side surface 1003c"

In the Claims:

Column 50, line 12, "gate of second transistor" should read "gate of the second transistor"